US00RE36842E

United States Patent [19]

Arimoto et al.

[11] E Patent Number: Re. 36,842

[45] Reissued Date of Patent: Aug. 29, 2000

[54] SEMICONDUCTOR MEMORY DEVICE FOR MAINTAINING LEVEL OF SIGNAL LINE

[75] Inventors: Kazutami Arimoto; Shigeki Tomishima; Hideto Hidaka, all of Tokyo, Japan

[73] Assignee: Mitsubishi Denki Kabushiki Kaisha, Tokyo, Japan

[21] Appl. No.: 09/070,016

[22] Filed: Apr. 30, 1998

Related U.S. Patent Documents

Reissue of:

[64] Patent No.: 5,513,142
Issued: Apr. 30, 1996
Appl. No.: 08/357,007
Filed: Dec. 16, 1994

[30] Foreign Application Priority Data

Dec. 28, 1993 [JP] Japan ..... 5-337106

[51] Int. Cl.[7] ..... G11C 13/00

[52] U.S. Cl. ..... 365/189.11; 365/226; 365/230.06

[58] Field of Search ..... 365/189.11, 226, 365/230.06, 189.01, 189.04, 189.09

[56] References Cited

U.S. PATENT DOCUMENTS 5,408,435 4/1995 McClure ..... 365/226

OTHER PUBLICATIONS

"Subthreshold—Current Reduction Circuits for Multi–Gigabit DRAM's" Takeshi et al, General Research Laboratory, Hitachi Ltd. Date Unknown.

"WP3.4: 265MB DRAM Technologies for File Applications" G. Kitsukawa et al, 1993 IEEE ISSC Conference, 1993.

"Drawing of NEC's 4M DRAM products (42400)" sold in the U.S. before Dec. 28, 1993.

"High–Speed, High–Reliability Circuit Design for Megabit DRAM", Gillingham et al., IEEE Journal of Solid–State Circuits, vol. 26, No. 8, Aug. 1991, pp. 1171–1175.

"Circuit Techniques For a Wide Word I/O path 64 Meg DRAM", Komatsuzaki et al., 1991 Symposium on VLSI Circuits, Digest of Technical Papers, May 30–Jun. 1, 1991, pp. 133–134.

*Primary Examiner*—Terrell W. Fears
*Attorney, Agent, or Firm*—McDermott, Will & Emery

[57] ABSTRACT

A memory array $MA_0$ is divided into four sub memory arrays by sense amplifier strips. Word drivers belonging to each sub memory array are connected to a corresponding segment boosted signal line. A fuse is connected to each segment boosted signal line. By blowing out a fuse, the sub memory array corresponding to the blown out fuse is no longer used. The sub memory array that is no longer used is exchanged with a spare sub memory array of a spare memory array.

46 Claims, 23 Drawing Sheets

SEMICONDUCTOR MEMORY DEVICE FOR MAINTAINING LEVEL OF SIGNAL LINE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to semiconductor memory devices, and more particularly, to a semiconductor memory device having a circuit structure for maintaining the level of a boosted signal line and a word driver connected to the boosted signal line, and a redundancy structure.

2. Description of the Background Art

FIG. 21 is a block diagram of a conventional semiconductor memory device.

Referring to FIG. 21, a semiconductor memory device of a dynamic RAM includes a memory array 161, a row address buffer 164, a row decoder 163, word drivers 162*a*–162*h*, a column address buffer 167, a column decoder 166, a sense amplifier 165, an input/output circuit 168, and a control circuit 169. Memory array 161 has bit lines and word lines disposed vertically and horizontally therein. Row address buffer 164 receives an externally applied row address. Row decoder 163 receives an output of row address buffer 164. Word drivers 162*a*–162*h* respond to an output of row decoder 163 to drive a word line. Column address buffer 167 receives an externally applied column address. Column decoder 166 receives an output of column address buffer 167. Sense amplifier 165 responds to an input from column decoder 166 to amplify a small current of memory array 161. Input/output circuit 168 carries out input/output of data with sense amplifier 165 via an I/O line. Control circuit 169 receives a row address strobe signal (/RAS), a column address strobe signal (/CAS), and a read/write control signal (W) to control the above device.

The operation of this semiconductor memory device will be described hereinafter. In response to an output of row address buffer 164 to which a row address is input, row decoder 163 selects a word line corresponding to a specified row address. For example, in FIG. 21, when the top most word line is selected, word driver 162*a* pulls up that word line. Then, sense amplifier 165 operates, whereby a small current read out from a memory cell at the crossing of a bit line and a word line in memory array 161 is amplified. In response to an output of column address buffer 167 to which a column address is input, column decoder 166 selects a bit line pair. The selected bit line pair is connected to an I/O line connected between input/output circuit 168 and sense amplifier 165. The data on the I/O line is amplified by a preamplifier in input/output circuit 168 to be transmitted to an output buffer for a read out operation. Externally applied data is transferred to the I/O line by a write buffer of input/output circuit 168 for a write operation.

There are some semiconductor memory devices that have a spare memory cell arranged besides memory array 161 of N (=nxm) bits for exchange of a defective bit.

In general, a memory cell includes a capacitor and an n channel MOS transistor. One electrode of the capacitor is fixed to a potential ½ Vcc which is half the power supply potential Vcc. The n channel MOS transistor has the gate electrode connected to a word line. The n channel MOS transistor is connected to the other electrode of the capacitor and a bit line. A predetermined potential is maintained at the other electrode of the capacitor to store data. When power supply potential $V_{CC}$ is to be transferred from a bit line to the other electrode of the capacitor without a voltage drop of the threshold voltage Vth of the n channel MOS transistor, a potential of a $V_{PP}$ level that is higher than $V_{CC}+V_{th}$ must be supplied from the word line to the gate electrode of this n channel MOS transistor. A semiconductor memory device that needs a potential of such a $V_{PP}$ level will be described hereinafter.

FIG. 22 is a block diagram of the main components of the semiconductor memory device of FIG. 21. FIG. 23 is a circuit diagram of the word driver of FIG. 22.

Referring to FIGS. 22 and 23, submemory arrays 171*a* and 171*b* are separated by a sense amplifier 172. At one side of submemory arrays 171*a* and 171*b*, row decoders 173*a* and 173*b* are provided, respectively. 4 n word lines are provided between row decoder 173*a* and submemory array 171*a*, and also between row decoder 173*b* and submemory array 171*b*. A word driver is provided at each word line. For example, word drivers 174*a*, 174*b*, 174*c* and 174*d* are provided at the upper 4 word lines disposed between row decoder 173*a* and submemory array 171*a*. Word drivers 175*a*, 175*b*, 175*c* and 175*d* are provided at the upper 4 word lines disposed between row decoder 173*b* and submemory array 171*b*. Boosted signal lines are disposed in the vertical direction with respect to the word lines disposed in the horizontal direction in the drawing.

The boosted signal line to which a boosted decode signal $RX_1$ is input is connected to word drivers 174*a* and 175*a*. The boosted signal line to which a boosted decode signal $RX_2$ is input is connected to word drivers 174*b* and 175*b*. The boosted signal line to which a boosted decode signal $RX_3$ is input is connected to word drivers 174*c* and 175*c*. The boosted signal line to which a boosted decode signal $RX_4$ is input is connected to word drivers 174*d* and 175*d*.

In other words, word lines are disposed so that word drivers 174*a* and 175*a* provided at the topmost word lines in submemory arrays 171*a* and 171*b*, respectively, receive boosted decode signal $RX_1$; word drivers 174*b* and 175*b* provided at the respective second word lines receive boosted decode signal $RX_2$; word drivers 174*c* and 175*c* provided at the respective third word lines receive boosted decode signal $RX_3$; and word drivers 174*d* and 175*d* provided at the respective fourth word lines receive boosted decode signal $RX_4$. Also, the word driver provided at the fifth word line receives boosted decode signal $RX_1$, and the word driver provided at the sixth word line receives boosted decode signal $RX_2$. Such boosted decode signals are repeatedly input to the word drivers.

In addition to a boosted decode signal, each word driver receives an output (signals WD, ZWD) of the row decoder.

As shown in FIG. 23, word driver 174 includes an n channel MOS transistor (N1) 181*a*, an n channel MOS transistor (N2) 181*b*, and an n channel MOS transistor (N3) 181*c*. n channel MOS transistor 181*a* functions as a transfer gate. A signal WD which is decoded to a level in row decoder 173*a* is applied to one of the source/drain thereof. Power supply voltage Vcc is applied to the gate thereof. n channel MOS transistor 181*b* receives boosted decode signal $RX_1$ at its drain and an output of n channel MOS transistor 181*a* at its gate. n channel MOS transistor 181*c* has its gate supplied with an inversion signal ZWD of signal WD which is decoded to a level by row decoder 173*b*, and its source supplied with ground potential GND. The drain of n channel MOS transistor 181*c* is connected to the source of n channel MOS transistor 181*b*.

The operation thereof will be described hereinafter. Signal WD which is decoded to a certain level in row decoder 173*a* and an inversion signal thereof ZWD are input to the word driver provided at each word line. When each word driver attains a standby state (de-select state), signal WD attains a L level and inversion signal ZWD attains a H level. Therefore, n channel MOS transistor 181*b* is turned off, and n channel MOS transistor 181*c* is turned on. Therefore, word line WL is pulled to ground potential GND by n channel MOS transistor 181*c,* and is not activated.

When signal WD attains a H level, a node A is charged to the level of $V_{CC}$–$V_{th}$ which is power supply voltage $V_{CC}$ minus the threshold voltage via n channel MOS transistor 181*a*. Because inversion signal ZWD attains a L level when signal WD attains a H level, n channel MOS transistor 181*a* is off, and word line WL is not connected to ground potential GND. When node A is charged and the boosted level of the decoded boosted decode signal $RX_1$ is applied to the drain of n channel MOS transistor 181*b,* node A is boosted by the coupling of the gate and drain, i.e. self boosted, so that n channel MOS transistor 181*b* is deeply turned on. As a result, word line WL is sufficiently charged to the boosted level to be selected. Therefore, access to a memory array is allowed.

A word line is selected to be pulled up only when signal WD and boosted decode signal $RX_l$ both attain a H level. The word line will not be selected in other combinations since it is not pulled up. In other words, decoding is also carried out in a word driver.

FIG. 24 shows the addition of a spare submemory array including a spare memory cell to be exchanged for a defective memory cell in the memory array of FIG. 22. In FIG. 24, elements corresponding to those of FIG. 22 have the same reference characters denoted, and their description will not be repeated.

Referring to FIG. 24, a spare memory cell array 191*a* is provided between memory cell array 171*a* and sense amplifier 172. A spare submemory array 191*b* is provided between submemory array 171*b* and a sense amplifier not shown. At one side of spare submemory arrays 191*a* and 191*b,* corresponding spare row decoders 192*a* and 192*b* are provided. A spare word line is disposed between spare row decoder 192*a* and spare submemory array 191*a,* and between spare row decoder 192*b* and spare submemory array 191*b*.

Spare word drivers 193*a,* 193*b,* 193*c,* and 193*d* are provided at respective spare word lines in order from the topmost spare word line disposed between spare row decoder 192*a* and spare submemory array 191*a*. Spare word drivers 194*a,* 194*b,* 194*c* and 194*d* are provided at respective spare word lines provided between spare row decoder 192*b* and spare submemory array 191*b*. Spare word drivers 193*a* and 194*a* provided at the respective topmost spare word lines receive boosted decode signal $RX_1$. Spare word drivers 193*b* and 194*b* provided at the second spare word lines receive boosted decode signal $RX_2$. Spare word drivers 193*c* and 194*c* provided at the third spare word lines receive boosted decode signal $RX_3$. Spare word drivers 193*d* and 194*d* provided at the fourth spare word lines receive boosted decode signal $RX_4$.

When a fault is generated in a memory cell in, for example, submemory array 171*a,* a fuse 195*a* provided in spare row decoder 192*a* is blown out. In response, the row address corresponding to the defective memory cell is substituted for the row address corresponding to a spare memory cell in spare memory array 191*a* to carry out exchange. Each of the structure of spare word drivers 193*a*–193*d,* 194*a*–194*d* is similar that of the word driver shown in FIG. 23, and their description will not be repeated.

There are semiconductor memory devices that use boosted voltage instead of a decode boosted signal. FIG. 25 is a block diagram of such a semiconductor memory device. FIG. 26 is a circuit diagram of a word driver shown in FIG. 25.

Referring FIGS. 25 and 26, submemory arrays 201*a* and 201*b* are divided by a sense amplifier 202. At one side of submemory arrays 201*a* and 201*b,* corresponding row decoders 203*a* and 203*b* are provided. A plurality of word lines are disposed between row decoder 203*a* and submemory array 201*a* with word drivers 205*a*–205*h* respectively. Similarly, a plurality of word lines are disposed between row decoder 203*b* and submemory array 201*b* with word drivers 206*a*–206*h* respectively.

Word drivers 205*a*–205*h* are connected to the same segment boosted signal line 207*a*. One end of segment boosted signal 207*a* is connected to one of the source/drain of switching transistor 204*a*. The gate of switching transistor 204*a* receives a control signal $\phi_1$. The other source/drain of switching transistor 204*a* is connected to a global boosted signal line 208*a* having a potential level of boosted voltage $V_{PP}$. In response to control signal $\phi_1$, switching transistor 204*a* is turned on/off, whereby boosted voltage $V_{PP}$ is supplied to each of word drivers 205*a*–205*h* via segment boosted signal line 207*a*.

Similarly, word drivers 206*a*–206*h* are connected to a same segment boosted signal line 207*b*. The other end of segment boosted signal line 207*b* is connected to one source/drain of switching transistor 204*b*. The gate of switching transistor 204*b* receives a control signal $\phi_2$. The other source/drain of switching transistor 204*b* is connected to a global boosted signal line 208*b* having a boosted voltage $V_{PP}$. Global boosted signal lines 208*a* and 208*b* are eventually connected to a $V_{PP}$ generation circuit not shown for generating boosted voltage $V_{PP}$.

Word drivers 205*a*–205*h* and 206*a*–206*h* receive, not only boosted voltage $V_{PP}$ transmitted via switching transistor 204*a* and 204*b,* but also an inversion signal ZWD which is a signal completely decoded by row decoders 203*a* and 203*b* and converted into a boosted level. For example, word driver 205 includes a p channel MOS transistor (P1) 211, and an n channel MOS transistor (N1) 212, as shown in FIG. 26. p channel MOS transistor 211 has its gate supplied with decode signal ZWD, and its source connected to segment boosted signal line 207*a*. n channel MOS transistor 212 has its gate supplied with decode signal ZWD, and its source connected to ground potential GND. Thus, word driver 205*a* is formed as a CMOS inverter circuit that operates between a supplied boosted potential $V_{PP}$ and ground potential GND.

An operation of particularly submemory array 201*a* will be described hereinafter.

When control signal $\phi_1$ attains a level of boosted voltage $V_{PP}$, switching transistor 204*a* is off. Therefore, boosted voltage $V_{PP}$ is not supplied to each of word drivers 205*a*–205*h*. When control signal $\phi_1$ attains the level of ground potential GND, switching transistor 204*a* is on. Boosted voltage $V_{PP}$ is supplied to each of word drivers 205*a*–205*h* via segment boosted signal line 207*a* when switching transistor 204*a* is on.

When signal ZWD output from row decoder 203*a* attains the level of boosted voltage $V_{PP}$, p channel MOS transistor 211 is off and n channel MOS transistor 212 is on. Therefore, word line WL is pulled down to ground potential GND by n channel MOS transistor 212 to attain a standby (de-select)

state. When signal ZWD attains a L level, n channel MOS transistor 212 is off and is not in conduction with ground potential GND. Therefore, p channel MOS transistor 211 attaining an on state causes word line WL to be charged sufficiently to the level of boosted potential $V_{PP}$. Thus, a sufficiently charged word line WL is selected.

There are also semiconductor memory devices that have switching transistors removed, as shown in FIG. 27. Boosted voltage $V_{PP}$ is directly applied to a word driver via a global boosted signal line 221.

In recent years, the circuit complexity has increased as the memory capacity becomes greater, resulting in increase of the consumed current. It is envisioned that consumed current can be suppressed if the circuit complexity is simplified. However, such simplification in circuitry should not cause reduction in reliability thereof. It is also important to speed access in a semiconductor memory device. Furthermore, the exchange efficiency of a spare memory in the case of a fault in a submemory array and the chip area of the spare submemory array are also important factors. A semiconductor memory device with a high exchange efficiency and a small chip area is desired.

Here, exchange efficiency refers to the unit of a group of memory cells that are exchanged in using one spare submemory array when a defective submemory cell is exchanged for a proper spare memory cell. This means that a large group requires a larger memory capacity on the basis of a spare submemory array with respect to one exchange. This will cause increase in the chip area of the spare submemory array.

In recent years, a semiconductor memory device that carries out exchange, not in the unit of word lines as shown in FIG. 24, but in the unit of submemory arrays, has attracted a lot of attention. Such a semiconductor memory device is disclosed in the Journal of Technical Papers of ISSCC 93, pp. 48–49.

However, conventional semiconductor memory devices have problems set forth in the following.

In the semiconductor memory device shown in FIG. 25, when submemory array 201*a* is de-selected, and switching transistor 204*a* attains a non-conductive state, charge will leak from segment boosted signal line 207*a* via each of word drivers 205*a*–205*h* due to subthreshold leakage current therein. This causes reduction in potential of segment boosted signal line 207*a* from the level of boosted potential $V_{PP}$. When submemory array 201*a* is selected and transistor 204*a* is conductive, segment boosted signal line 207*a* must be boosted up to the level of boosted potential $V_{PP}$ again. If the potential of segment booted signal line 207*a* was lowered to a level in the vicinity of ground potential, the boosting up to the level of boosted potential $V_{PP}$ will be time consuming, resulting in a slow access time.

Furthermore, in a semiconductor memory that carries out exchange in the unit of submemory arrays, a submemory array is directly exchanged with a spare submemory array. Therefore, the exchange efficiency is low. Furthermore, it is difficult to increase the number of spare submemory arrays from the standpoint of the chip area. Therefore, it was difficult to improve the yield.

There are also problems in a semiconductor memory device that carries out exchange in a word line unit as shown in FIG. 24. When leakage occurs in a segment boosted signal line due to a defective word line, all the word lines associated with that segment boosted signal line will also become defective. Therefore, the exchange efficiency will become the same as that of exchange carried out in the unit of submemory arrays.

In the semiconductor memory device of FIG. 25, the transition rate of a word driver from a standby state to an active state depends upon the potential of a segment boosted signal line. More specifically, when a switching transistor is off, the potential will become as low as the level of ground potential in the worst case due to junction leakage and subthreshold leakage. During the time period of the potential of the segment boosted signal pulled up to the level of boosted potential $V_{PP}$, the word driver cannot attain an active state. Therefore a high speed operation could not be carried out.

In the semiconductor memory device shown in FIG. 27 where switching transistors are removed and boosted voltage $V_{PP}$ is supplied directly from global boosted signal line 221 to a word driver, there is a problem that the consumed current becomes so great that it causes standby current fault when current begins to leak from global boosted signal line 221 due to a fault in a word driver. When the word driver shown in FIG. 26, for example, is applied to the semiconductor memory device shown in FIG. 27, such a fault with respect to a word driver includes the generation of a great leakage current due to a great potential difference between a boosted voltage $V_{PP}$ and ground voltage GND applied on p channel MOS transistor 211. Furthermore, the output of the row decoder applied to the word driver must be completely decoded, causing increase in the circuit complexity of the row decoder. This results in a problem that the layout pitch is reduced with respect to a row decoder.

In the word driver of FIG. 23, if the self boost by means of coupling at n channel MOS transistor 181*b* is not sufficient, the selected word line will not have a sufficient level to be driven. This results in an insufficient opening of the transfer gate to cause erroneous operation. Adjustment was made to carry out a complete self boost by delaying boosted decode signal $RX_1$ by delay means. However, the delay time by the delay means varies due to a change in the process, resulting in the possibility of an erroneous operation. Increase in the delay time of boosted decode signal RX slows the access time. It is extremely difficult to design the timing in which a complete self boost is carried out without delay.

When boosted decode signal $RX_1$ is applied to n channel MOS transistor 181*b* with node A at the level of $V_{CC}-V_{th}$, the potential of word line WL will rise only to the level of $V_{CC}-V_{th}$. It is therefore necessary to input boosted decode signal $RX_1$ after node A is sufficiently charged. More specifically, it is necessary to carry out the so-called double boosting for node A to be boosted to the level of $V_{CC}+V_{PP}-V_{th}$ to transmit boosted voltage $V_{PP}$ of the boosted decode signal to word line WL. However, a great potential difference is applied between the source and gate of n channel MOS transistor 181*b*, resulting in the possibility of the reliability of n channel MOS transistor 181*b* being degraded.

SUMMARY OF THE INVENTION

In view of the foregoing, an object of the present invention is to provide a semiconductor memory device that has consumed power due to leakage at a boosted signal line suppressed.

Another object of the present invention is to improve the exchange efficiency of a semiconductor memory device that has exchange carried out.

A further object of the present invention is to provide a semiconductor memory device that has the chip area of the entire memory array reduced.

A still further object of the present invention is to provide a semiconductor memory device that provides a voltage of a potential level between a boosted potential and a ground potential to a word driver so that the word driver is rendered active speedily.

Yet another object of the present invention is to provide a semiconductor memory device including a word driver that can have the chip area and nuclear of elements of a decoder reduced.

According to an aspect of the present invention, a semiconductor memory device includes a memory array ($MA_0$) having a plurality of memory cells (MC) connected to a plurality of word lines ($WL_0$–$WL_{255}$), a global boosted line (GL) to which a boosted potential (Vpp) higher than power supply potential Vcc is applied, a segment boosted line ($SL_0$) provided corresponding to the submemory array ($MA_0$), a word line select unit ($RD_0$) for selecting any of the plurality of word lines ($WL_0$–$WL_{255}$), a word line activation unit ($DRVG_0$) responsive to an output from the word line select unit ($RD_0$) for providing the potential of the segment boosted line ($SL_0$) to a selected one of the plurality of word lines ($WL_0$–$WL_{255}$) to activate the same, a first switching unit (6) connected between the segment boosted line ($SL_0$) and the global boosted line (GL) for selecting an electrical connection of the segment boosted line ($SL_0$) with the global boosted line (GL), and a potential maintaining unit (7, 8, 17, 18, 19, 220, Vcc) for maintaining the potential of the segment boosted line ($SL_0$) at a potential between the ground potential and the boosted potential (Vpp) applied to the global boosted line (GL).

According to the present aspect, the potential maintaining unit maintains the potential of the segment boosted line at a potential between the ground potential and the boosted potential, so that the consumed current required to generate a boosted voltage is only that of the difference between the boosted potential and the potential. Therefore, consumed current can be suppressed.

According to the present aspect, the potential between the boosted potential and the ground potential is supplied to a word driver in a word line activation unit by the potential maintaining unit, so that the word driver can pull up the word line speedily. Thus, a high speed access can be achieved.

According to another aspect of the present invention, a semiconductor memory device includes a word line activation unit ($DRV_0$) for activating a word line ($WL_0$). The word line activation unit ($DRV_0$) includes a first first conductivity type transistor (261) having a control electrode supplied with a row decode signal (ZWD) and a first electrode supplied with a boosted decode signal ($RX_{ik}$), and a second conductivity type transistor (271) connected in series with the first first conductivity type transistor (261), having a control electrode supplied with the same row decode signal (ZWD).

According to the present aspect, a boosted decode signal is applied to the word line activating unit ($DRV_1$). Because a boosted voltage is not always supplied, consumed current can be suppressed.

According to the present aspect, in addition to the above advantage, a difficult timing design is not required. Therefore, a word line activation unit ($DRV_0$) that accesses a memory at high speed is provided. Thus, the layout pitch of a row decoder and the like that provides a boosted decode signal to the word line activation unit ($DRV_0$) can be improved.

According to a further aspect of the present invention, a semiconductor memory device includes a memory array ($MA_0$) having a plurality of memory cells (MC) connected to a plurality of word lines ($WL_0$–$WL_{255}$). The submemory array ($MA_0$) includes a plurality of memory cell groups ($SBMA_{00}$–$SBMA_{03}$). Each memory cell group array includes a predetermined number of the plurality of word lines ($WL_0$–$WL_{255}$). The semiconductor memory device further includes a plurality of segment boosted lines ($SL_{00}$–$SL_{03}$), each provided corresponding to each memory cell group ($SBMA_{00}$–$SBMA_{03}$), and to which a boosted potential (Vpp) higher than the power supply potential (Vcc) is selectively applied, a word line select unit ($RD_0$) for selecting any of the plurality of word lines ($WL_0$–$WL_{255}$), and a word line activation unit ($DRVG_0$) responsive to an output from the word line select unit ($RD_0$) for transmitting the potential of a segment boosted line to which the boosted potential (Vpp) is selectively applied out of the plurality of segment boosted lines ($SL_{00}$–$SL_{03}$) to any of the predetermined number of word lines in each memory cell group.

According to the present aspect, the submemory array is divided into a plurality of memory cell groups with corresponding segment boosted signal lines. A boosted potential is supplied to only the segment boosted signal line that has leakage. Therefore, the consumed current is suppressed.

The semiconductor memory device of the present aspect further includes a spare memory array (SMA) having a plurality of spare memory cells connected to a plurality of spare word lines. The spare memory array (SMA) includes a spare memory cell group ($SSBMA_0$), wherein the spare memory cell group ($SSBMA_0$) has a predetermined number of the plurality of spare word lines. The semiconductor memory device further includes a spare segment boosted line ($SSL_{so}$) provided corresponding to the spare memory cell group ($SSBMA_0$), supplied with a boosted potential (Vpp) which was to be applied to each segment boosted line ($SL_{00}$–$SL_{03}$) corresponding to each memory cell group ($SBMA_{00}$–$SBMA_{03}$) substituted with the spare memory cell group ($SSBMA_0$), a spare word line select unit (SRD) for selecting any of the plurality of spare word lines, a spare word line activation unit (SDRVG) responsive to an output of the spare word line select unit (SRD) for providing the potential of the spare segment boosted line ($SSL_{so}$) to any of the predetermined number of spare word lines included in the spare memory array ($SSBMA_0$) for activating the same, and an inhibiting unit (49, 57, 58, 59, 60, 301, 305, 307, 309, 311) for inhibiting the provision of the boosted potential (Vpp) to each segment boosted line ($SL_{00}$–$SL_{03}$) corresponding to each memory cell array ($SBMA_{00}$–$SBMA_{03}$) substituted with the spare memory cell array ($SSBMA_0$).

According to the present aspect, in addition to the above advantage, exchange is carried at the unit of memory cell groups which are formed corresponding to a segment boosted signal line. Therefore, the exchange efficiency can be improved, and the chip area of the spare memory cell group can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
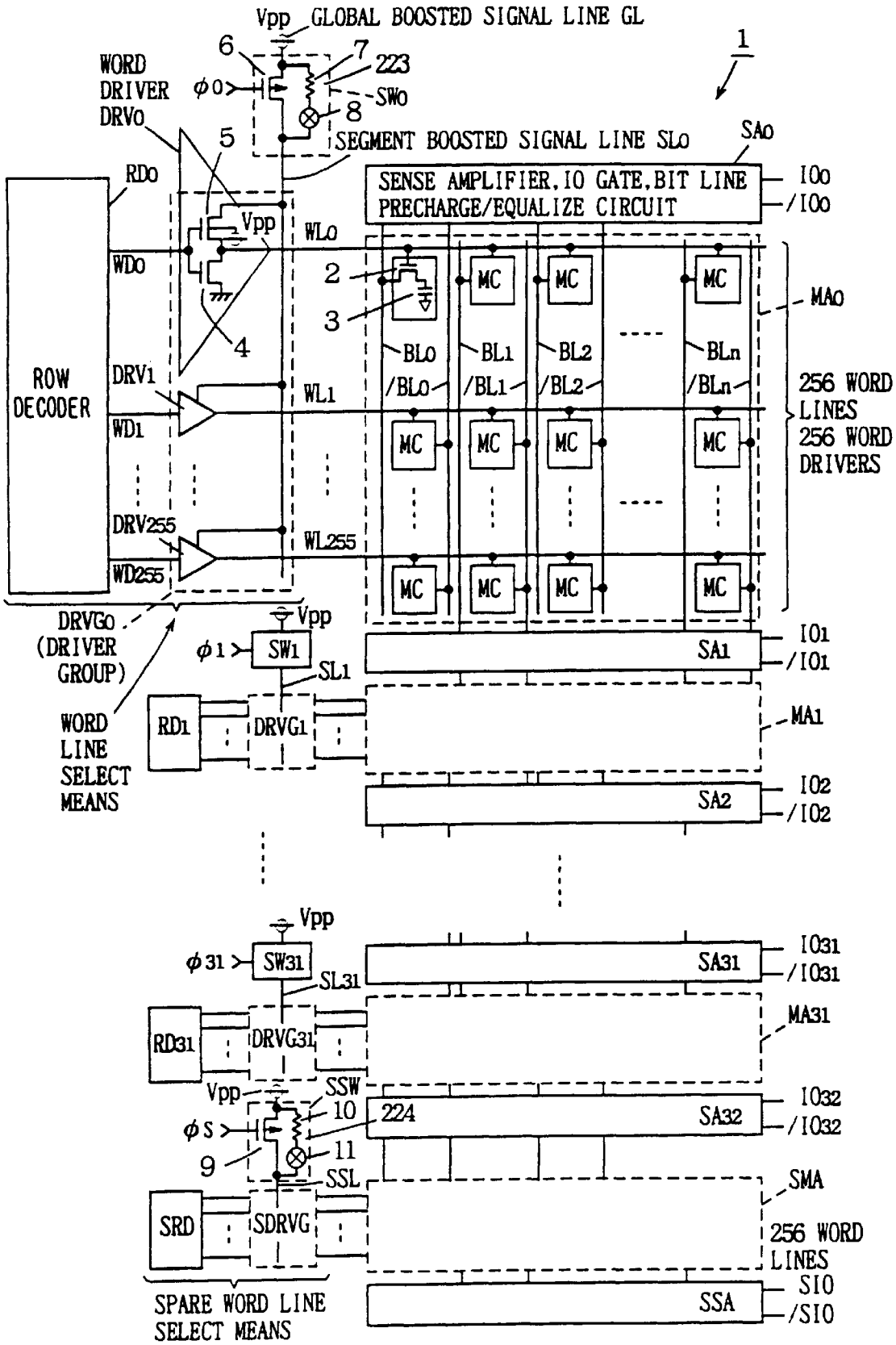
FIG. 1 is a block diagram showing a semiconductor memory device according to a first embodiment of the present invention.

Referring to FIG. 1, a semiconductor memory device 1 includes a plurality of submemory arrays $MA_0$–$MA_{31}$, a global boosted signal line GL to which a boosted voltage $V_{PP}$ is applied, segment boosted line signals $SL_0$–$SL_{31}$, a word line select unit for selecting word lines $WL_0$–$WL_{255}$ arranged in submemory array $MA_0$–$MA_{31}$, sense amplifier bands $SA_0$–$SA_{32}$, and switching units $SW_0$–$SW_{31}$ for selectively switching the connection of global boosted signal line GL to segment boosted signal lines $SL_0$–$SL_{31}$. Semiconductor memory device 1 further includes a spare memory array SMA that can be substituted with any of submemory arrays $MA_0$–$MA_{31}$, a spare segment boosted signal line SSL, a spare word line select unit for selecting a spare word line connected to spare memory array SMA, a spare sense amplifier band SSA, and a spare switching unit SSW for selectively switching the connection of global boosted signal line GL to spare segment boosted signal line SSL.

Plurality of submemory arrays $MA_0$–$MA_{31}$ and spare memory array SMA include a plurality of memory cells MC connected between 256 word lines and bit lines pairs $BL_0$, $/BL_0$–$BL_n$, $BL_n$. Each memory cell MC includes a capacitor 3 and an n channel MOS transistor 2 connected between capacitor 3 and bit lines $BL_0$–$BL_n$ ($/BL_0$–$/BL_n$). The gate electrode of each n channel MOS transistor 2 is connected to respective word lines $WL_0$–$WL_{255}$.

The word line select unit includes word driver groups $DRVG_0$–$DRVG_{31}$, and row decoders $RD_0$–$RD_{31}$. Word driver groups $DRVG_0$–$DRVG_{31}$ are respectively formed of word drivers $DRV_0$–$DRV_{255}$ provided at word lines $WL_0$–$WL_{255}$, respectively. Each of word drivers $DRV_0$–$DRV_{255}$ includes n channel MOS transistor 4 and p channel MOS transistor 5 to which the output signals of row decoders $RD_0$–$RD_{31}$ are applied. p channel MOS transistor has its well potential connected to boosted potential $V_{PP}$. Bit line pairs $BL_0$, $/BL_0$–$BL_n$, $/BL_n$ are connected to sense amplifier bands $SA_0$–$SA_{32}$. Sense amplifier bands $SA_0$–$SA_{32}$ include a sense amplifier, an IO gate and a bit line precharge/equalizer circuit, and is connected to I/O line pairs $IO_0$, $/IO_{0-IO32}$, $/IO_{32}$.

Similarly, the spare word line select unit includes a spare word driver group SDRG and a spare row decoder SRD. Bit line pairs $BL_0$, $/BL_0$–$BL_n$, $/BL_n$ are connected to a spare sense amplifier band SSA. The internal sense amplifier is connected to a spare I/O line pair SIO, /SIO.

Each of switching units $SW_0$–$SW_{31}$ is connected between global boosted signal line GL and each of segment boosted signal line $SL_0$–$SL_{31}$. Each of switching units $SW_0$–$SW_{31}$ includes a switching transistor 6 to which control signals $\phi_0$–$\phi_{31}$ are respectively input to the gate thereof, and a series element 223 of a high resistor 7 and a fuse 8 provided parallel to switching transistor 6. Similarly, spare switching unit SSW is connected between global boosted signal line GL and spare segment boosted signal line SSL. Spare switching unit SSW includes a switching transistor 9 to which control signal $\phi_s$ is applied to its gate thereof, and a series element 224 of a high resistor 10 and a fuse 11 provided parallel to switching transistor 9.

High resistor 7 in switching units $SW_0$–$SW_{31}$ and high resistor 10 in spare switching unit SSW are resistors of a long channel length and a small channel width to obtain high resistance with a small layout area. High resistor 7 or high resistor 10 is used as the channel resistor of a p channel MOS transistor, connected between global boosted signal line GL and segment boosted signal line $SL_0$–$SL_{31}$ or spare segment boosted signal line SSL, to which ground potential is applied to its gate electrode. The resistance of the channel resistor is set to a high value in comparison with the ON resistance of switching transistors 6 and 9.

Figure 2:
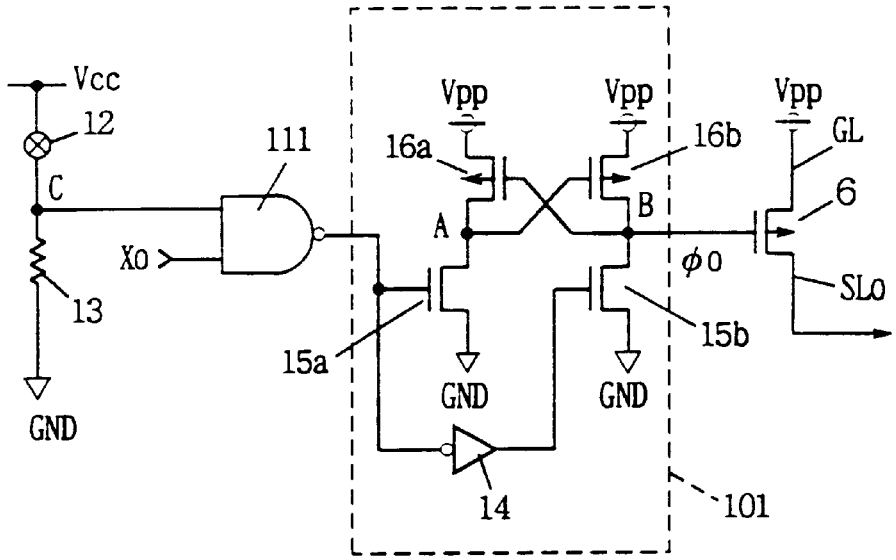
FIG. 2 shows a circuit for generating a control signal $\phi_0$ which is an example of a control signal $\phi_i$ input to the switching transistor of FIG. 1.

A circuit for generating a control signal $\phi_i$ that is input to the gate of a switching transistor will be described hereinafter. As shown in FIG. 2, a circuit generating a control signal $\phi_0$ includes a level conversion unit 101, a NAND gate 111, a fuse 12, and a resistor 13. Fuse 12 is connected between power supply voltage $V_{CC}$ and a node C. Resistor 13 is connected between node C and ground potential GND. An output according to the state of fuse 12 and resistor 13 from node C is applied to one input of NAND gate 111. A memory array select signal $X_0$ is applied to the other input of NAND gate 111. The output of NAND gate 111 is applied to level conversion unit 101.

Level conversion unit 101 includes an n channel MOS transistor 15*a* having a gate to which the output of NAND gate 111 is input and a source connected to ground potential GND, an inverter 14 to which the output of NAND gate 111 is input, and an n channel MOS transistor 15*b* having a gate supplied with the output of inverter 14 and a source connected to ground potential GND. Level conversion unit 101 further includes a p channel MOS transistor 16*b* having a gate connected to the drain of n channel MOS transistor 15*a* via a node A, and a source connected to boosted voltage $V_{PP}$, and a p channel MOS transistor 16*a* having a gate connected to the drain of n channel MOS transistor 15*b* via node B and a source connected to boosted voltage $V_{PP}$.

The drain of p channel MOS transistor 16*a* is connected to the drain of n channel MOS transistor 15*a* and the gate of p channel MOS transistor 16*b* via node A. The drain of p channel MOS transistor 16*b* is connected to the drain of n channel MOS transistor 15*b* and the gate of p channel MOS transistor 16*a* via node B. Control signal $\phi_0$ is applied from node B of level conversion unit 101 to the gate of switching transistor 6.

The operation of the circuit for generating a control signal $\phi_0$ shown in FIG. 2 will be described hereinafter.

When there is no leakage in segment boosted signal line $SL_0$, fuse 12 is not blown out. The output of NAND gate 111 attains a L level when memory array select signal $X_0$ attains a H level, and control signal $\phi_0$ which is the output of level conversion unit 101 attains a L level to turn on switching transistor 6. As a result, submemory array $MA_0$ is selected. When memory array select signal $x_0$ attains a L level, control signal $\phi_0$ attains a H level to turn off switching transistor 6. Therefore, submemory array $MA_0$ is not selected.

When there is a great leakage in a segment boosted signal line $SL_0$, fuse 12 is blown out to prevent boosted potential $V_{PP}$ of global boosted signal line GL from being supplied to segment boosted signal line $SL_0$ when switching transistor 6 is turned on. Therefore, the output of NAND gate 111 always attains a H level, and control signal $\phi_0$ which is the output of level conversion unit 101 always attains the level of boosted potential $V_{PP}$. Therefore, switching transistor 6 always attains an off state. As a result, global boosted signal line GL is not connected to segment boosted signal line $SL_0$, so that the $V_{PP}$ generation circuit that generates boosted potential $V_{PP}$ does not operate. Thus, consumed current is suppressed.

When fuse 8 is blown out or when switching transistor 6 is off, the well potential of p channel transistor 5 attains a floating state if the well potential and the source potential are equal. Therefore, the well potential of p channel transistor 5 is connected to boosted potential $V_{PP}$ because there is a problem that latch up or the like easily occurs.

It is to be noted that connection leakage current or subthreshold leakage current is generated in switching transistors 4 and 5 forming word drivers $DRV_0$–$DRV_{255}$. Therefore, charge leaks from segment boosted signal line $SL_i$ or from spare segment boosted signal line SSL even when submemory array $MA_i$ or spare memory array SMA corresponding to switching transistors 4 and 5 is not selected and switching transistors 6 and 9 to which control signal $\phi_i$ of the level of boosted potential $V_{PP}$ was provided attains a non-conductive state. The potential of segment boosted signal line $SL_i$ or spare segment boosted signal line SLL will become lower than the level of boosted potential $V_{PP}$ due to the charge leakage.

In the first embodiment, high resistors 7 and 10 are provided between global boosted signal line GL and segment boosted signal line $SL_i$ or spare segment boosted signal line SSL, so that a small current flows corresponding to the leaking charge via high resistors 7 and 10. Therefore, segment boosted signal line $SL_i$ or spare segment boosted signal line SSL is maintained at the level of boosted potential $V_{PP}$. When submemory array $MA_i$ is selected to cause control signal $\phi_i$ to attain ground potential and switching transistor 6 conducts, boosted voltage $V_{PP}$ is immediately transmitted from segment boosted signal line $SL_i$ to the word line by the word driver receiving a decode signal of a L level. Thus, a high speed read out can be carried out.

There is a case where a fault is generated in any of word drivers $DRV_0$–$DRV_{255}$ due to attachment of a contaminant or the like, causing a great leakage current flow from segment boosted signal line $SL_i$ via the defective word driver. Here, switching transistor 6 attains a non-conductive state, and the low current from high resistor 7 cannot compensate for this great leakage current. There is the possibility that the potential of the segment boosted signal line becomes as low as a level near ground potential. Here, fuse 8 of segment boosted signal line $SL_i$ belonging to the word driver in which a fault is generated is blown out, whereby the low current flowing from global boosted signal line GL to segment boosted signa line $SL_i$ is cut off. Therefore, consumed current is reduced.

Even though word drivers $DRV_0$–$DRV_{255}$ with respect to submemory array $MA_i$ substituted with spare memory array SMA are not used, junction leakage current or subthreshold leakage current is generated in word drivers $DRV_0$–$DRV_{255}$ belonging to the not-used submemory array $MA_i$. By blowing out fuse 8 belong to that segment boosted signal line $SL_i$ the small current, although low in level, is prevented from being supplied to segment boosted signal line $SL_i$ by high resistor 7. Therefore, consumed current is reduced.

Figure 3:
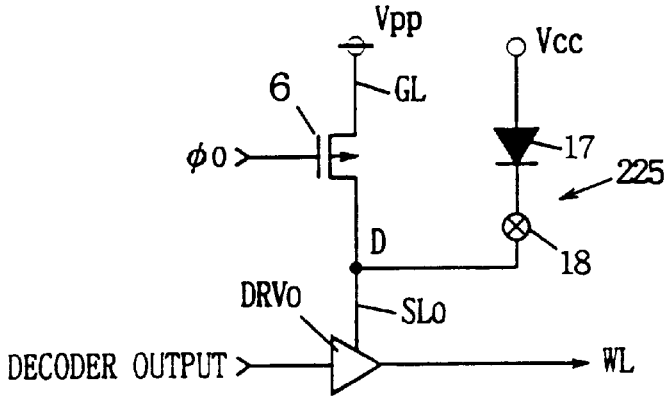
FIGS. 3–5 are diagrams showing the main components of a semiconductor memory device according to second to fourth embodiments, respectively, of the present invention.

FIG. 3 shows the main components of a semiconductor memory device according to a second embodiment of the present invention, and corresponds to the portion of switching units $SW_0$–$SW_{31}$ and spare switching unit SSW of FIG. 1. In the following, only the components differing from those of FIG. 1 will be described.

Referring to FIG. 3, a diode device 17 is provided instead of high resistor 7. Diode device (circuit) 17 includes an n channel MOS transistor of a threshold voltage $V_{th}$ (for example 0.6 V) connected between the power supply node to which power supply potential $V_{CC}$ (for example 3.3 V) is applied and a segment boosted signal line $SL_i$ (i=0, 1, 2, . . . , 31), and having a gate electrode connected to the power supply node. When the potential of segment boosted signal line $SL_0$, for example, becomes lower than $V_{CC}$–$V_{th}$, diode device 17 conducts so that charge is supplied from the power supply potential node to segment boosted signal line $SL_0$. Thus, the potential is maintained at $V_{CC}$–$V_{th}$. When the potential of the segment boosted signal line becomes higher than $V_{CC}$–$V_{th}$, diode device 17 is rendered non-conductive. A fuse 18 is provided between diode device 17 and segment boosted signal $SL_0$ via a node D. A series element 225 is formed of diode device 17 and fuse 18.

Submemory array $MA_i$ and spare memory array SMA will be described hereinafter focusing on submemory array $MA_0$. When there is a leakage due to a defect in submemory array $MA_0$ and word drivers $DRV_0$–$DRV_{255}$, or a leakage in segment boosted signal line $SL_0$ by adherence of a contamination, or when there is a defect in submemory array $MA_0$ without any leakage, global boosted signal line GL must be disconnected from segment boosted signal line $SL_0$. However, this disconnection may be avoided depending upon the leakage state by applying power supply potential $V_{CC}$ provided from diode device 17.

For example, when switching transistor 6 attains a non-conductive state in the case where there is no defect except that the leakage current is greater than the design value due to a simple offset in the manufacturing process, charge is supplied by diode circuit 17 from the power supply potential node to segment boosted signal line $SL_0$ to compensate for the leakage current. The potential of segment boosted signal line $SL_0$ will not be extremely reduced, and is maintained at the level of $V_{CC}$–$V_{th}$. It is not necessary to disconnect global boosted signal line GL from segment boosted signal line $SL_0$ when charge is supplied from global boosted signal line GL to segment boosted signal line $SL_0$ so that segment boosted signal line $SL_0$ is promptly restored to the level of boosted potential $V_{PP}$ when switching transistor 6 conducts.

However, when the potential of segment boosted signal line $SL_0$ is lowered to the level in the vicinity of ground potential even when charge is supplied by diode device 17 from the power supply potential node to segment boosted signal line $SL_0$, it is necessary to disconnect global boosted signal line GL from segment boosted signal line $SL_0$. In this case, fuse 12 of the circuit generating control signal $\phi_0$ shown in FIG. 2 is to be blown out. As a result, the signal applied to the gate of switching transistor 6 attains the level of $V_{PP}$, whereby switching transistor 6 is turned off. By blowing out fuse 18 provided between diode device 17 and segment boosted signal line $SL_0$, the $V_{PP}$ generation circuit that generates boosted potential $V_{PP}$ applied to global boosted signal line GL will not operate. Therefore, consumed current is suppressed.

Because diode circuit 17 is provided between the power supply node and the segment boosted signal line in the second embodiment, the current is maintained at $V_{CC}$–$V_{th}$ even when there is a slight leakage of current from the segment boosted signal line when the switching transistor attains a non-conductive state. Therefore, the potential of the segment boosted signal line is not lowered to the level in the vicinity of the ground potential. Boosted potential $V_{PP}$ can be promptly transmitted to the selected word line when switching transistor 6 conducts.

Similar to the first embodiment, fuse 18 is provided between diode circuit 17 and segment boosted signal line $SL_0$. When there is a fault in a word driver caused by the adherence of a contaminant causing a great amount of leakage current from segment boosted signal line $SL_0$ via this word driver and when switching transistor 6 attains a non-conductive state, fuse 18 is to be blown out. As a result, the current flowing from the power supply potential node to the segment boosted signal line via diode circuit 17 is cut off, so that consumed current is reduced.

Even when the word driver is proper and spare memory array SMA is exchanged due to a defective submemory array $MA_0$, the blow out of fuse 18 prevents diode circuit 17 from compensating for the junction leakage current or subthreshold leakage current of the driver in submemory array $MA_o$ which is no longer used. Therefore, consumed current is reduced.

Because charge is supplied to segment boosted signal line $SL_0$ from the power supply potential node, and not from global boosted signal line GL as in the first embodiment, a greater amount of current can be conducted in comparison with that of the first embodiment even if the consumed power for this provision is identical to that of a first embodiment. Therefore, in the case where the consumed current is limited and there is not defect except that the leakage current from the segment boosted signal is greater than the design value due to offset in the manufacturing process, a current for compensating for the leakage current is supplied from the power supply node to segment boosted signal line $SL_0$ via diode circuit 17. Therefore, the potential of segment boosted signal line $SL_0$ is maintained at the level of $V_{CC}$–$V_{th}$, so that submemory array $MA_0$ does not have to be exchanged by spare memory array SMA. Thus, the yield is improved.

Suppression of a leakage current is attributed to necessity of a great amount of power being consumed due to generation of boosted potential $V_{PP}$ from power supply potential $V_{CC}$ by a charge pumping operation. Assuming that the power directly consumed from power supply potential $V_{CC}$ is 1 mW, for example, the power consumed from boosted potential $V_{PP}$ become 3 mW which is three times that of the case of power supply potential $V_{CC}$ on the basis that 2 mW is required to generate 1 mW by boosted potential $V_{PP}$. If power consumption is limited to 1 mW, a current of 1 mW can be conducted from power supply potential $V_{CC}$. However, only current of 0.33 mW can be conducted from boosted potential $V_{PP}$ which is ⅓ the former.

Figure 4:
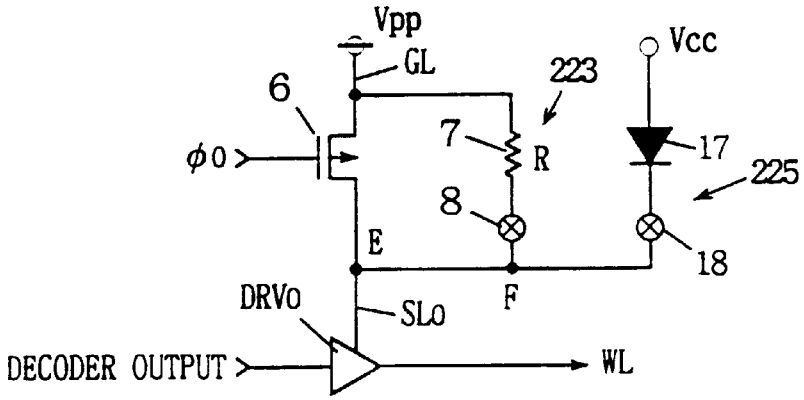

FIG. 4 shows the main components of a semiconductor memory device according to a third embodiment of the present invention. The third embodiment is a combination of the first embodiment and the second embodiment.

Referring to FIG. 4, there are provided a series element 223 formed of high resistor 7 and fuse 8, and a series element 225 formed of a diode circuit 17 and a fuse 18. Diode circuit 17 is connected to power supply potential $V_{CC}$. The output of diode circuit 17 is applied to word driver $DRV_0$. Fuse 18 is provided between node F and diode circuit 17. The provision of fuse 18 is not limited to the position between node F and diode circuit 17, and may be provided between power supply potential $V_{CC}$ and diode circuit 17. Because the resistance of high resistor 7 is higher than the on resistance of diode circuit 17, diode circuit 17 can conduct a current greater than that of high resistor 7.

When there is a leakage in the node of segment boosted signal line $SL_0$, boosted potential $V_{PP}$ is supplied to word driver $DRV_0$ via high resistor 7. However, the potential level of segment boosted signal line $SL_0$ will be reduced if there is only high resistor 7 when the leakage becomes greater. However, when the potential level of segment boosted signal line $SL_0$ becomes as low as the level of $V_{CC}$–Δ (junction potential), power supply potential $V_{CC}$ is supplied to word driver $DRV_0$ via diode 17.

The current compensating for the leakage is not all generated by the $V_{PP}$ generation circuit, and the sum of the current supplied via high resistor 7 and that supplied via diode circuit 17 is the current that compensates for the leakage. The sum of the current consumed at the $V_{PP}$ generation circuit and the current that is directly consumed from power supply potential $V_{CC}$ becomes the consumed current for compensating for the leakage. Therefore, the consumed current from $V_{PP}$ generation circuit to high resistor 7 is suppressed.

If the level of the leakage is such that can be compensated for by blowing out fuse 8, this circuit is similar to that of the embodiment shown in FIG. 3. When both fuses 8 and 18 are to be blown out, global boosted signal line GL is completely disconnected from segment boosted signal line $SL_0$ by blowing out also fuse 12 shown in FIG. 2 to set control signal $\phi_0$ at the level of $V_{PP}$.

Similar to the first embodiment, by providing high resistor 7 parallel to switching transistor 6, high speed read out can be carried out in the third embodiment. Furthermore, because diode circuit 17 is provided between the power supply node and the segment boosted signal line as in the second embodiment, the case where only the leakage current from segment boosted signal line is greater than the design value due to offset in the manufacturing process and there is no other default can be repaired. Therefore, the yield is improved.

Fuses 8 and 18 are provided between high resistor 7 and segment boosted signal line $SL_0$, and diode circuit 17 and segment boosted signal line $SL_0$. When the leakage current from segment boosted signal line $SL_0$ is great and switching transistor 6 attains a non-conductive state with the potential of segment boosted signal line $SL_0$ not boosted to the level of boosted potential $V_{PP}$ but at the level in the vicinity of $V_{CC}-V_{th}$, fuse 8 is to be blown out. As a result, the current flowing from global boosted signal line GL via high resistor 7 is cut off, so that consumed current is reduced.

Fuses 8 and 18 are to be blown out in the case where the leakage current is so great that the potential of segment boosted signal line $SL_0$ is reduced to the level in the vicinity of ground potential despite the supply of charge to segment boosted signal line $SL_0$ by high resistor 7 and diode circuit 17, and in the case where spare memory array SMA is substituted for submemory array $MA_0$ which has a defect although word driver $DRV_0$ is proper. Therefore, high resistance 7 and diode circuit 17 can be prevented from compensating for the leakage current in submemory array $MA_i$ which is no longer used. Therefore, consumed current is reduced.

Figure 5:
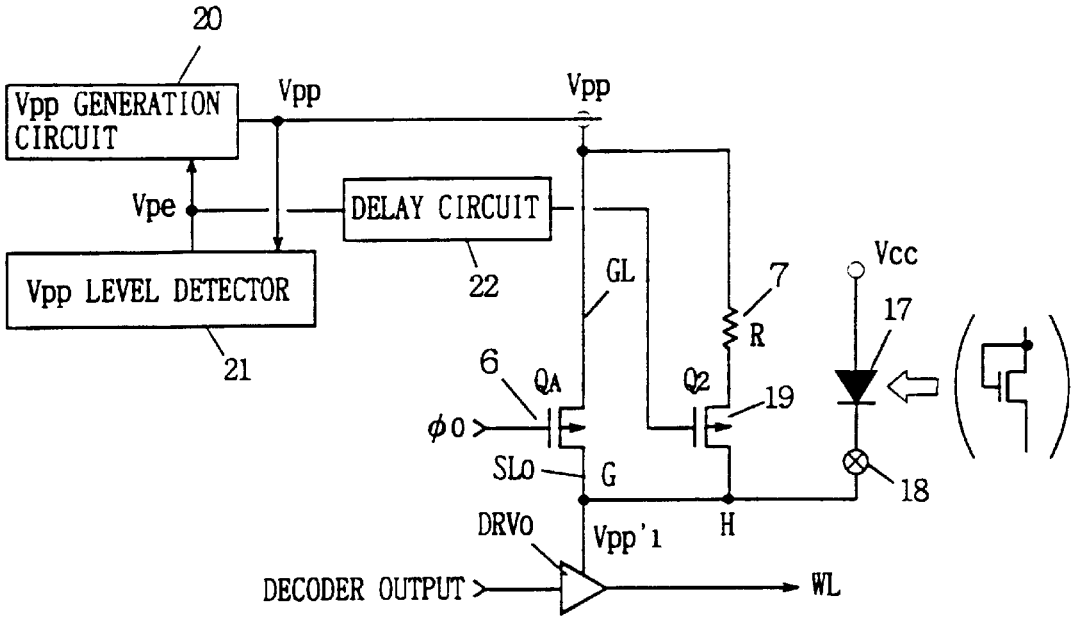

FIG. 5 shows the main components of a semiconductor memory device according to a fourth embodiment of the present invention. FIG. 6 is a diagram for describing the embodiment of FIG. 5.

In the fourth embodiment, fuse 8 of FIG. 4 is removed, and a switching transistor 19 is provided in series with high resistor 7. A $V_{PP}$ generation circuit 20 which was not shown previously is connected to global boosted signal line GL to supply boosted potential $V_{PP}$. A $V_{PP}$ level detector 21 is provided for detecting the potential level of boosted potential $V_{PP}$ supplied from $V_{PP}$ generation circuit 20 to output a signal $V_{Pe}$ for the activation or deactivation of $V_{PP}$ generation circuit 20. The output of $V_{PP}$ level detector 21 is applied to a delay circuit 22. The output of delay circuit 22 is applied to the gate of switching 6.

Figure 6A:
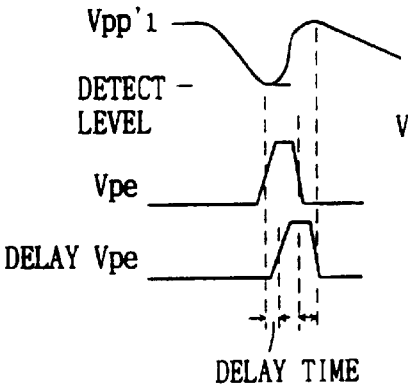
FIGS. 6A–6C are diagrams for describing the operation of the circuit of FIG. 5.
Figure 6B:
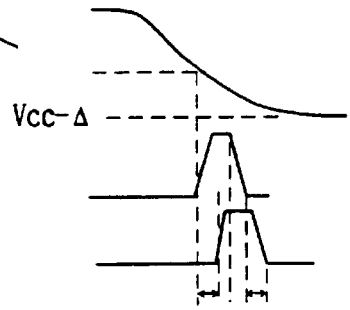
Figure 6C:
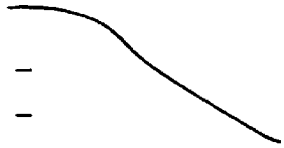

When the potential level of global boosted signal line GL becomes lower than a predetermined set value, $V_{PP}$ level detector 21 activates $V_{PP}$ generation circuit 20 by its output signal $V_{Pe}$. There may be three potential levels as shown in FIGS. 6A–C depending on the level of the leakage, if any, in segment boosted signal line $SL_0$. Here, the potential level of segment boosted signal line $SL_0$ is referred to as $V_{PP}$1'.

When the leakage is small and the level of $V_{PP}$1' falls to the detect level for $V_{PP}$ detector 21 to operate as shown in FIG. 6(A), $V_{PP}$ generation circuit 20 receiving the output signal $V_{Pe}$ is activated. This causes the level of boosted potential $V_{PP}$ and the level of $V_{PP}$1' to increase. Then, output signal $V_{Pe}$ of $V_{PP}$ level detector 21 is applied to delay circuit 22. The delay signal is applied to the gate electrode of switching transistor 19 to turn off switching transistor 19.

Then, $V_{PP}$ generation circuit 20 is deactivated by $V_{PP}$ level detector 21. Also, a delay signal of the signal that deactivated $V_{PP}$ generation circuit 20 is applied to the gate electrode of switching transistor 19, whereby switching transistor 19 is turned on. When the level of $V_{PP}$1' begins to fall, $V_{PP}$ generation circuit 20 is activated again by output signal $V_{Pe}$ by $V_{PP}$ level detector 21. By carrying out such repetition, the level of $V_{PP}$1' will fall only intermittently as shown in FIG. 6(A). This means that $V_{PP}$ generation circuit 20 is activated only intermittently, so that consumed current will not increase. Thus, the consumed current is maintained below the specification value of the standby current.

As shown in FIG. 6(B), when the leakage is greater than that shown in FIG. 6(A), the reduction in the level of $V_{PP}$1' to the detect level where $V_{PP}$ level detector 21 operates causes activation of the $V_{PP}$ generation circuit by output signal $V_{Pe}$. However, the leakage is greater than the current supplied by $V_{PP}$ generation circuit 20, so that the level of $V_{PP}$1' is further reduced. When the $V_{PP}$1' falls to the level of $V_{PP}-\Delta$, current from power supply potential $V_{CC}$ is supplied via diode device 17 to cease reduction in the level.

Because $V_{PP}$ generation circuit 20 continues activation as long as fuse 8 is not blown out n FIG. 4, the current which is the sum of the current generated at $V_{PP}$ generation circuit 20 and the current flowing from power supply potential $V_{CC}$ via diode circuit 17 becomes the standby current, resulting in a greater value. In FIG. 5, when the level of $V_{PP}$1' becomes lower than the detect level, output signal $V_{Pe}$, of $V_{PP}$ level detector 21 is applied to the gate electrode of switching transistor 19 via delay circuit 22. Switching transistor 19 is turned off, so that there is no leak path in global boosted signal line GL itself. Therefore, the potential level $V_{PP}$ of global boosted signal line GL is restored, and $V_{PP}$ generation circuit 20 is deactivated.

When the level of potential $V_{PP}$1' of segment boosted signal line $SL_0$ falls to the level of $V_{CC}-\Delta$, the current by power supply potential $V_{CC}$ is supplied to the word driver $DRV_0$ side via diode circuit 17. Therefore, the level of $V_{PP}$1' is maintained at $V_{CC}-\Delta$, and reduction in the level is suppressed. Therefore, the current for compensating for the leakage of $V_{PP}$1' is only that provided from power supply potential $V_{CC}$ via diode circuit 17. Therefore, the standby current is reduced, to suppress consumed current.

When the leakage is too great as shown in FIG. 6C, the level of potential $V_{PP}$1' of segment boosted signal line $SL_0$ is also reduced by the current according to power supply potential $V_{CC}$ by diode circuit 17. In this case, control signal $\phi_0$ applied to switching transistor 6 is controlled by the circuit shown in FIG. 2 to set the boosted potential to a H level, and fuse 18 is blown out. When the circuit of FIG. 2 is not used and control signal $\phi_0$ attains a L level, a fuse may be provided between node G and word driver $DRV_0$ which is to be blown out. It is not always necessary to provide a fuse 18.

Figure 7:
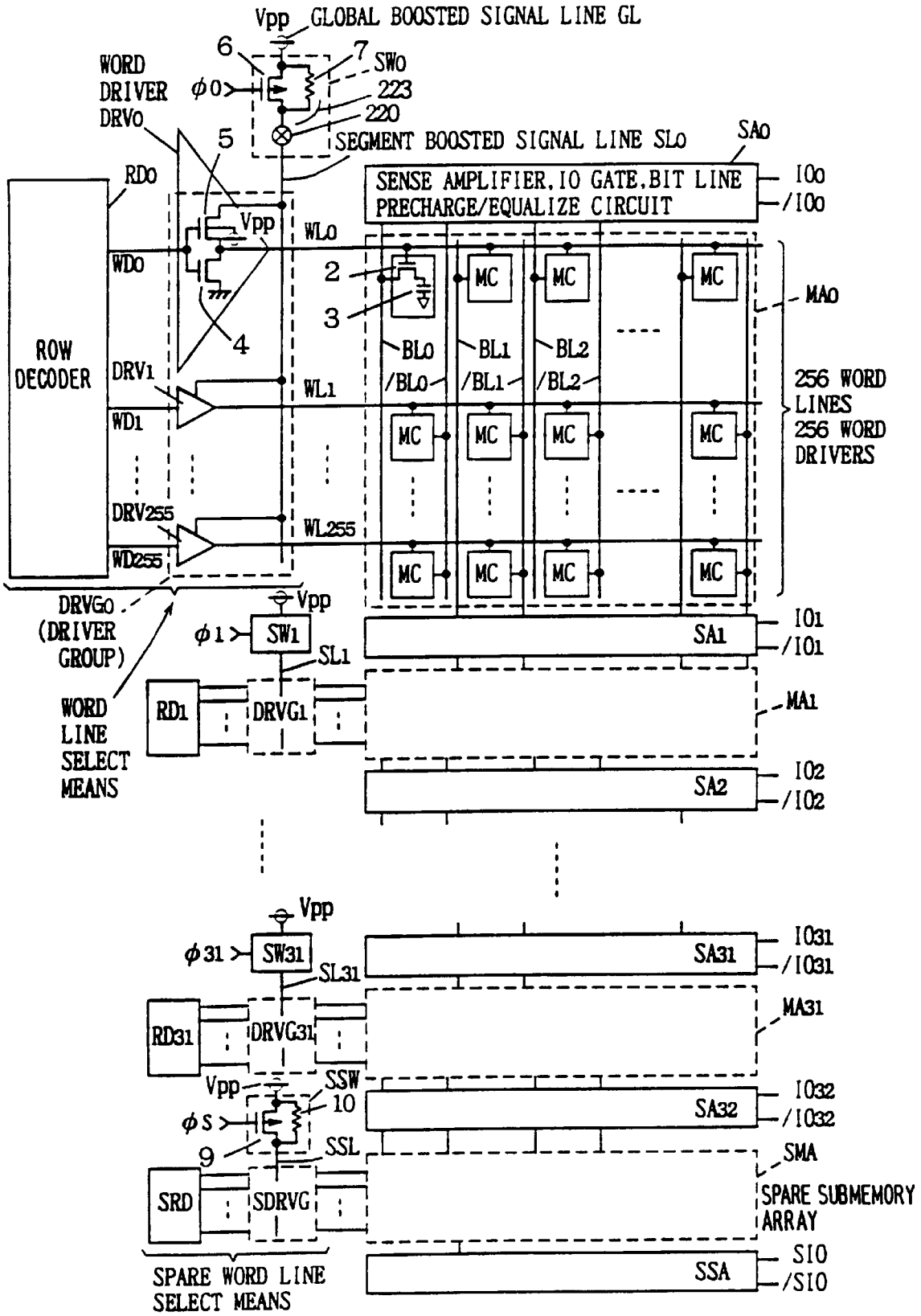
FIG. 7 is a block diagram of a semiconductor memory device according to a fifth embodiment of the present invention.
Figure 8:
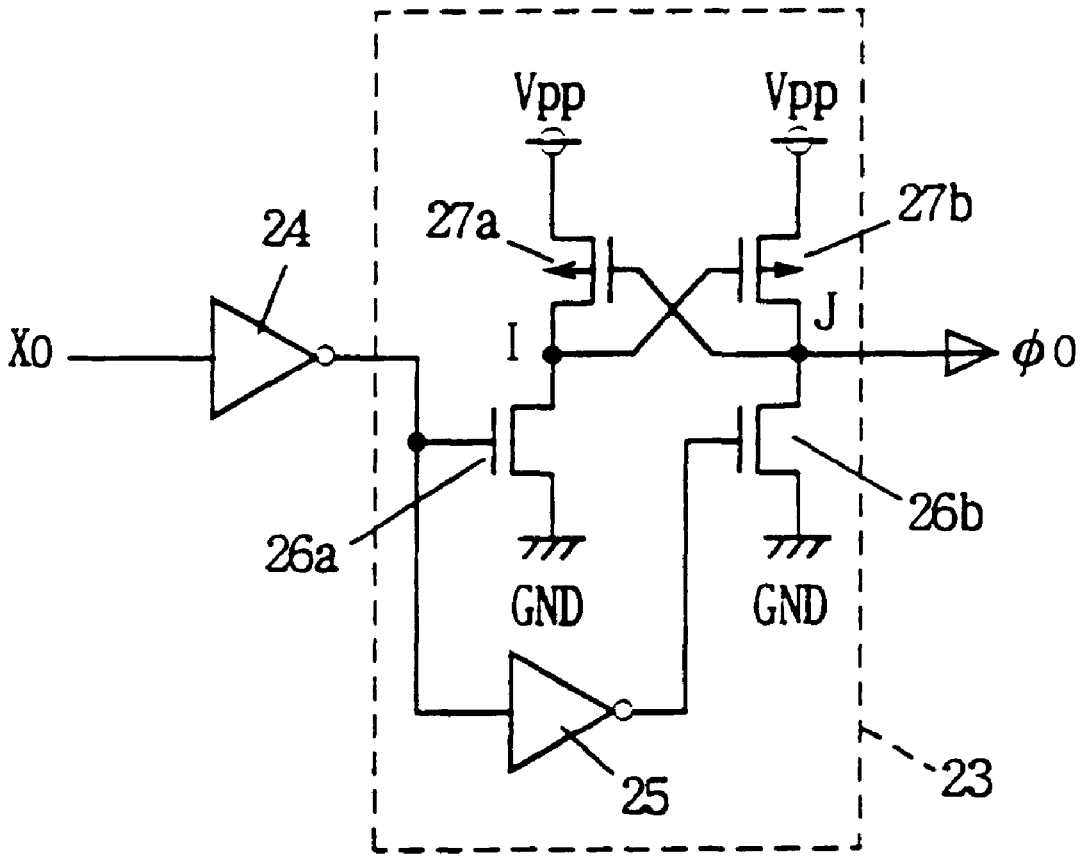
FIG. 8 shows a circuit for generating a control signal $\phi_0$ which is an example of a control signal $\phi_i$ which is input to the switching transistor of FIG. 7.

FIG. 7 is a block diagram schematically showing a semiconductor memory device according to a fifth embodiment of the present invention. FIG. 8 shows a circuit for generating a control signal $\phi_I$ (i=0, 1, 2, . . . , 31).

Components of the fifth embodiment differing from those shown in FIG. 1 will be described hereinafter.

Referring to FIG. 7, the present embodiment is characterized in a switching unit $SW_i$ provided corresponding to submemory array MAi, and a spare switching unit SSW provided corresponding to spare submemory array SMA. More specifically, fuse 8 of switching unit $SW_i$ of FIG. 1 is removed, and a fuse 220 is connected to segment boosting signal line $SL_i$ in series with the parallel element of switching transistor 6 and high resistor 7. A series element 223 is formed by high resistor 7 and fuse 220. Fuse 11 of spare switching unit SSW is removed.

Attention is focused on a circuit generating a control signal $\phi_0$ as a circuit for generating a control signal $\phi_i$. Referring to FIG. 8, a circuit generating a control signal $\phi_0$ includes a level conversion unit 23 and an inverter 24. Inverter 24 receives a memory array select signal $x_0$. The output of inverter 24 is applied to level conversion unit 23 from which a control signal $\phi_0$ is output. Level conversion unit 23 includes an inverter 25 corresponding to inverter 14 of level conversion unit 101 in FIG. 2, n channel MOS transistors 26*a* and 26*b* corresponding to n channel MOS transistors 15*a* and 15*b*, respectively, and p channel MOS transistors 27*a* and 27*b* corresponding to p channel MOS transistors 16*a* and 16*b*, n channel MOS transistors 26*a* and 26*b* and p channel MOS transistors 27*a* and 27*b* are connected with node I as node A and node J as node B.

Even if select signal $x_0$ of FIG. 8 is a signal that selects submemory array $MA_0$, leakage occurs in segment boosting signal line $SL_0$ when there is a fault in word drivers $DRV_0$–$DRV_{225}$ and in submemory array $MA_0$. In this case, global boosting signal line GL must be disconnected from segment boosted signal line $SL_0$. By blowing out fuse 220, boosted potential $V_{PP}$ of global boosted signal line GL will not be supplied to segment boosted signal line $SL_0$.

Similar to the first embodiment, because high resistor 7 is provided parallel to switching transistor 6 in the present fifth embodiment, a high speed read out can be carried out. Furthermore, because fuse 220 is provided between high resistor 7 and segment boosted signal line $SL_0$, consumed current is reduced as in the first embodiment.

Because a fuse 220 is provided between switching transistor 6 and segment boosted signal line $SL_0$, a fuse 220 corresponding to the exchanged submemory array $MA_0$ in substituting submemory array $MA_0$ with spare memory array SMA should be blown out. As a result, global boosted signal GL can be completely and easily disconnected from segment boosted signal line SL regardless of conduction or nonconduction of switching transistor 6. This separation can be carried out using the circuit that generates control signal $\phi_0$ as shown in FIG. 8 since the conduction or nonconduction of switching transistor 6 is not relied upon. Therefore, the circuit can be simplified in comparison with that shown in FIG. 2 of the first embodiment.

Figure 9:
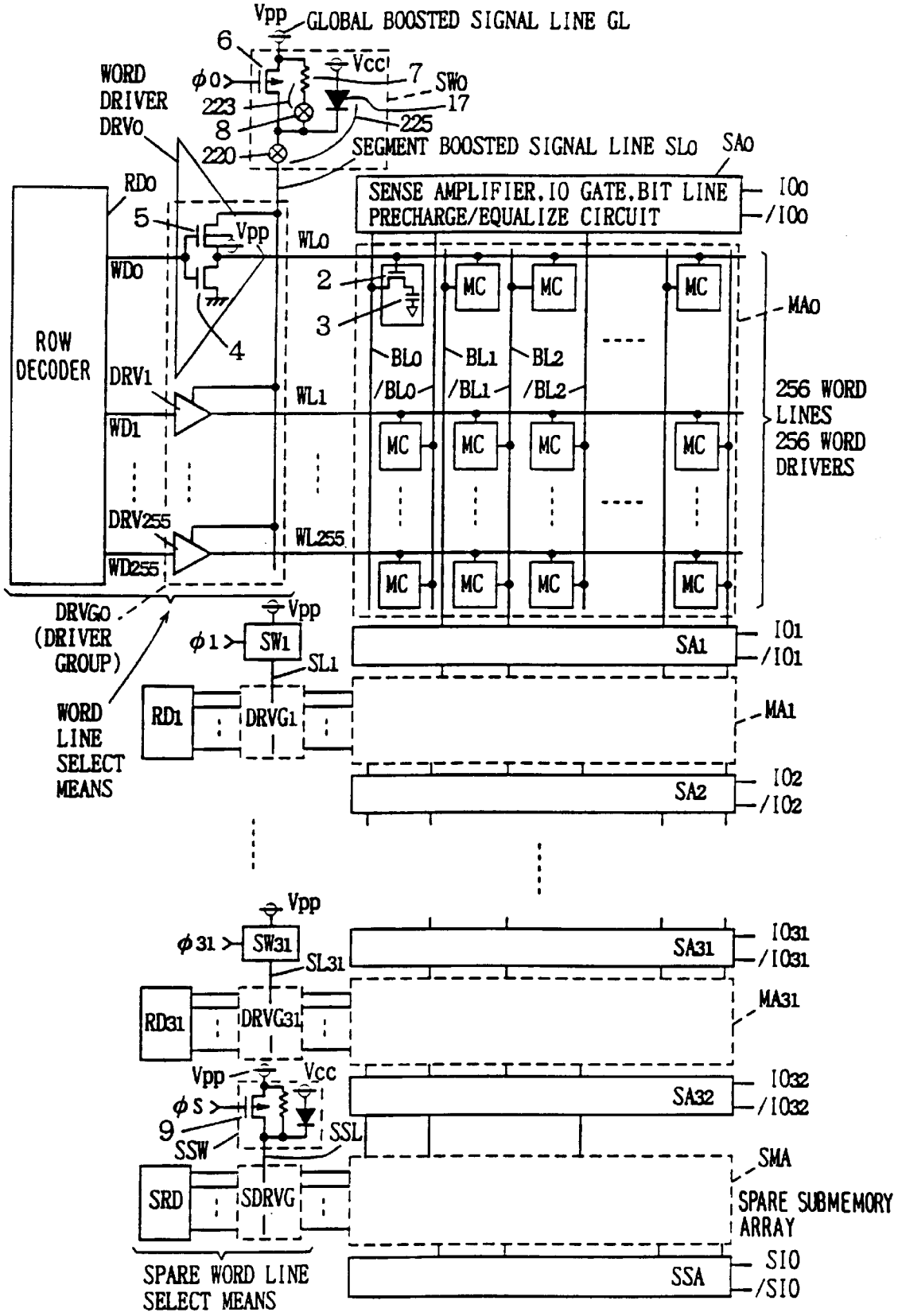
FIG. 9 is a block diagram schematically showing a semiconductor memory device according to a sixth embodiment of the present invention.

FIG. 9 is a block diagram schematically showing a semiconductor memory device according to a sixth embodiment of the present invention. Components differing from those shown in the third embodiment of FIG. 4 and the fifth embodiment of FIG. 7 will be described.

Fuse 18 of the third embodiment of FIG. 4 is removed and a fuse 221 is provided instead as in the embodiment shown in FIG. 7. A series element 223 is formed of high resistor 7 and fuse 8, and a series element 225 is formed of diode circuit 17 and fuse 220. Control signal $\phi_0$ applied to the gate electrode of switching transistor 6 is supplied by the circuit for generating control signal $\phi_0$ shown in FIG. 8. The present embodiment is characterized in that the effects similar to those of the third embodiment shown in FIG. 4 can be obtained.

More specifically, high resistor 7 is provided parallel to switching transistor 6, and diode circuit 17 is provided between the power supply node and segment boosted signal line $SL_0$. Therefore, a high speed read out can be carried out, and the yield improved.

Also, fuse 8 is provided between high resistor 7 and segment boosted signal line $SL_0$. When the leakage current from segment boosted signal line $SL_0$ is so great that it cannot rise to the level of boosted potential $V_{PP}$ and remains in the vicinity of $V_{CC}$–$V_{th}$ when switching transistor 6 attains a non-conductive state, fuse 8 is to be blown out. As a result, the current flowing to segment boosted signal line $SL_0$ from global boosted signal line GL via high resistor 7 is cut off, so that consumed current is reduced.

A fuse 221 is provided between switching transistor 6, high resistance 7 and diode circuit 17 and segment boosted signal line $Sl_0$. Fuse 220 is blown out when the leakage current is so great that the potential of segment boosted signal line falls to the level in the vicinity of ground potential even when charge is supplied to segment boosted signal line $SL_0$ by high resistor 7 and diode circuit 17, or when there is no fault with the word driver and spare memory array SMA is used due to a defective submemory array $MA_0$. This prevents the charge from being supplied to segment boosted signal line $SL_0$ from high resistor 7 and diode circuit 17 in the submemory array that is no longer used. Therefore, consumed current is reduced. The separation between global boosted signal line GL and segment boosted signal line $SL_0$ due to blowing out fuse 220 does not depend upon conduction or nonconduction of switching transistor 6. Therefore, the circuit for generating control signal $\phi_0$ is more simple than that of FIG. 2.

Figure 10:
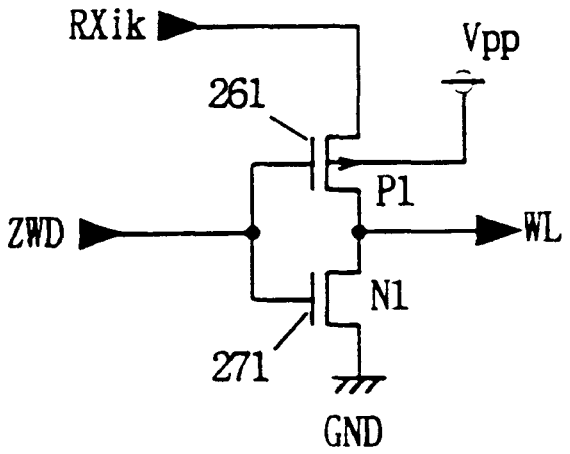
FIG. 10 is a circuit showing a word driver of a semiconductor memory device according to a seventh embodiment of the present invention.
Figure 11:
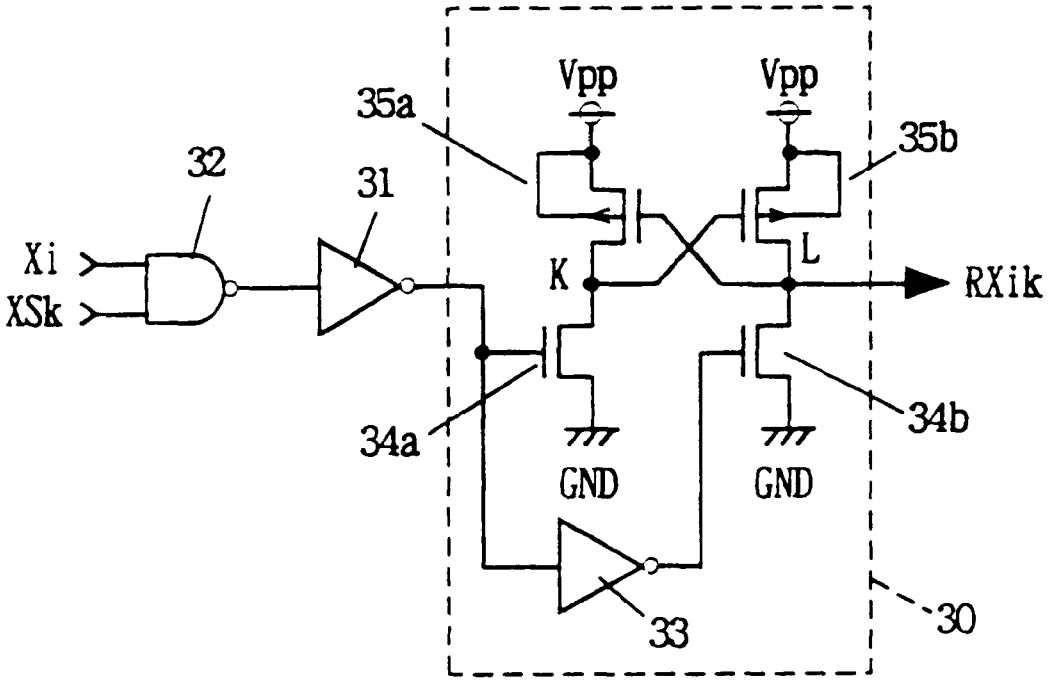
FIG. 11 shows a circuit for generating a boosted decode signal $RX_{ik}$ applied to the word driver of FIG. 10.

FIG. 10 is a circuit diagram of a word driver of a semiconductor memory device according to a seventh embodiment of the present invention. FIG. 11 shows a circuit for generating a boosted decode signal $RX_{ik}$ (i=0, 1, . . . , 31, k=0, 1, 2, 3) applied to the word driver of FIG. 10.

Referring to FIG. 10, boosted decode signal $RX_{ik}$ is applied to the source of p channel MOS transistor 261. An inversion signal ZWD which is an output of the row decoder is applied to p channel MOS transistor 261, so that word line WL is selected to be raised to the level of boosted potential $V_{PP}$ in combination with boosted decode signal $RX_{ik}$. Although boosted decode signal $RX_{ik}$ is generated by a circuit as shown in FIG. 11, the circuit structure includes a level conversion unit 30, an inverter 31, and a NAND gate 32.

Memory array select signal $x_i$ and predecode signal $XS_k$ are applied to NAND gate 32. The output of NAND gate 32 is applied to inverter 31. The output of inverter 31 is applied to level conversion unit 30. Level conversion unit 30 includes an inverter 33 corresponding to inverter 14 of level conversion unit 101 of FIG. 2, n channel MOS transistors 34*a* and 34*b* corresponding to n channel MOS transistors 15*a* and 15*b*, and p channel MOS transistors 35*a* and 35*b* corresponding to p channel MOS transistors 16*a* and 16*b*. n channel MOS transistors 34*a* and 34*b* and p channel MOS transistors 35*a* and 35*b* are connected with node K as node A and node L as node B. Boosted decode signal $RX_{ik}$ applied to the word driver of FIG. 10 is output from node L.

Boosted decode signal $RX_{ik}$ is generated on the basis of memory array select signal $x_i$ which attains a H level in response to a row address signal and a predecode signal $XS_k$ which attains a H level in response to a signal of 2 bits out of the row address signal. When memory array select signals $x_0$, $x_{16}$ and predecode signal $XS_0$ attain a H level according to an input address signal, and all the other signals attain a L level, boosted decode signal $RX_0$, $RX_{160}$ attain a level of boosted potential $V_{PP}$ and the other boosted decode signals attain the level of ground potential. As another example, when memory array select signals $x_1$ and $x_{17}$ and predecode signal $XS_1$ attain a H level and all the other signals attain a L level, boosted decode signals $RX_{11}$, $RX_{171}$ attain a level of boosted potential $V_{PP}$ and the other boosted decode signals attain the level of ground potential.

Because the word driver is formed of a CMOS inverter in the present seventh embodiment, it is not necessary to pull up the boosted decode signal to the level of boosted potential $V_{PP}$ after the decode signal from the row decoder is input to transmit the potential of the $V_{PP}$ level to the word line by a self boost. It is therefore not necessary to delay boosted decode signal $RX_{ik}$, so that high speed access can be carried out without delay in the access time period due to increase in the delay time of boosted decode signal $RX_{ik}$. Furthermore, the difficult timing design for determining a delay time of boosted decode signal $RX_{ik}$ so that the access time period is not delayed and sufficient self boosting is carried out are no longer required. Therefore, the timing design is simplified. Furthermore, the layout area for a delay circuit to delay boosted decode signal $RX_{ik}$ is reduced, so that the chip area can be made smaller.

Figure 26:
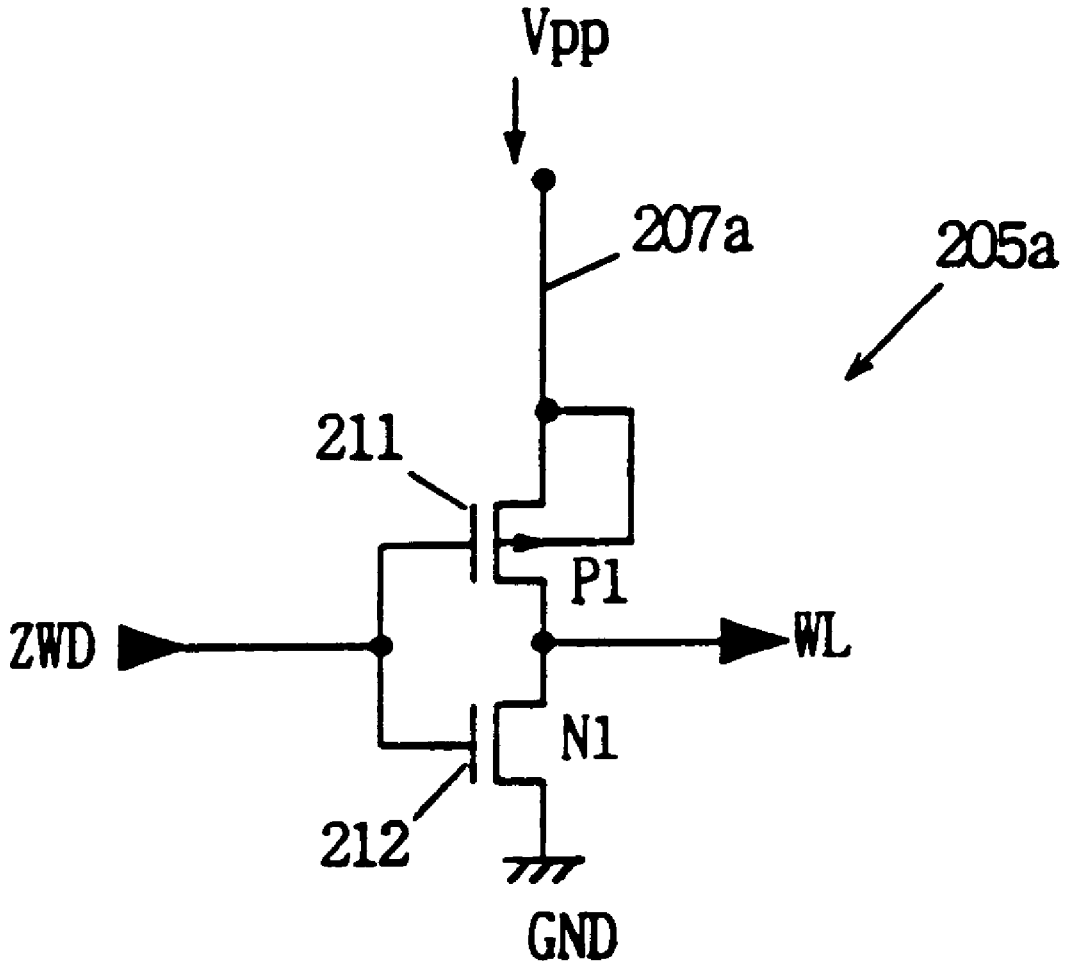
FIG. 26 PRIOR ART
FIG. 26 is a circuit diagram of a word driver of FIG. 25.
Figure 27:
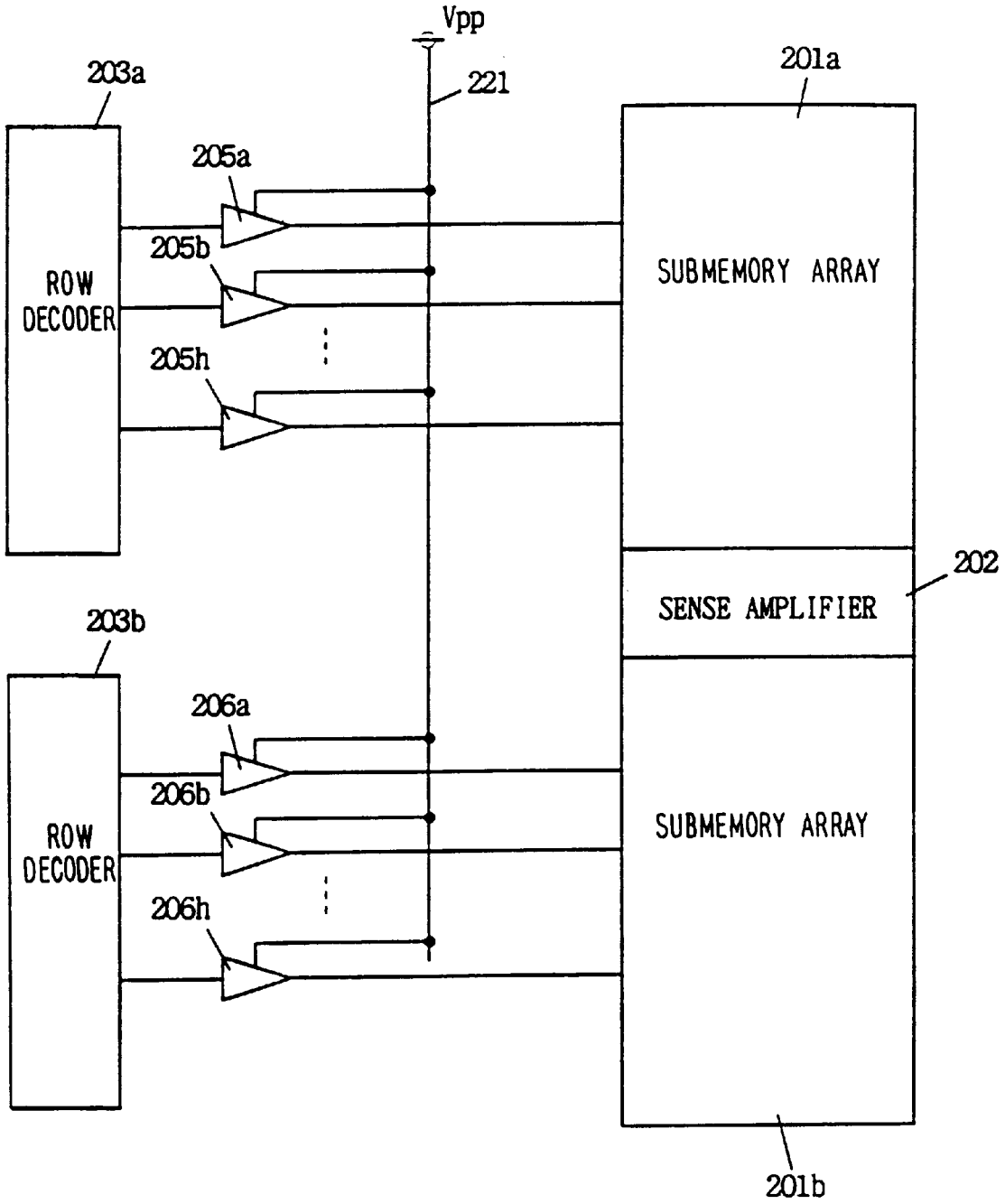
FIG. 27 PRIOR ART
FIG. 27 is a block diagram of a further conventional semiconductor memory device.

Furthermore, boosted potential $V_{PP}$ applied to the word driver formed of a CMOS inverter is applied as boosted decode signal $RX_{ik}$ from a circuit for generating a boosted decode signal and not from a global boosted signal line as shown in FIG. 26. Therefore, boosted decode signal $RX_{ik}$ attains the level of ground potential when a corresponding submemory array is de-selected, whereby the signal line transmitting $RX_{ik}$ is disconnected from the global boosted signal line. Therefore, a leakage current via a plurality of word drivers such as in the case where boosted potential $V_{PP}$ is directly applied from a global boosted signal line is not generated, so that consumed current is reduced. The fault of standby current $I_{CC}$ generated due to this leakage current is also suppressed.

Furthermore, it is not necessary to completely decode signal ZWD with a row decoder since decode can be carried out by the word driver itself using signal ZWD from the row decoder and boosted decode signal $RX_{ik}$. Therefore, the circuit complexity of the row decoder is reduced. The pitch of the word lines can be made more narrow to allow increase in the integration density.

Figure 12A:
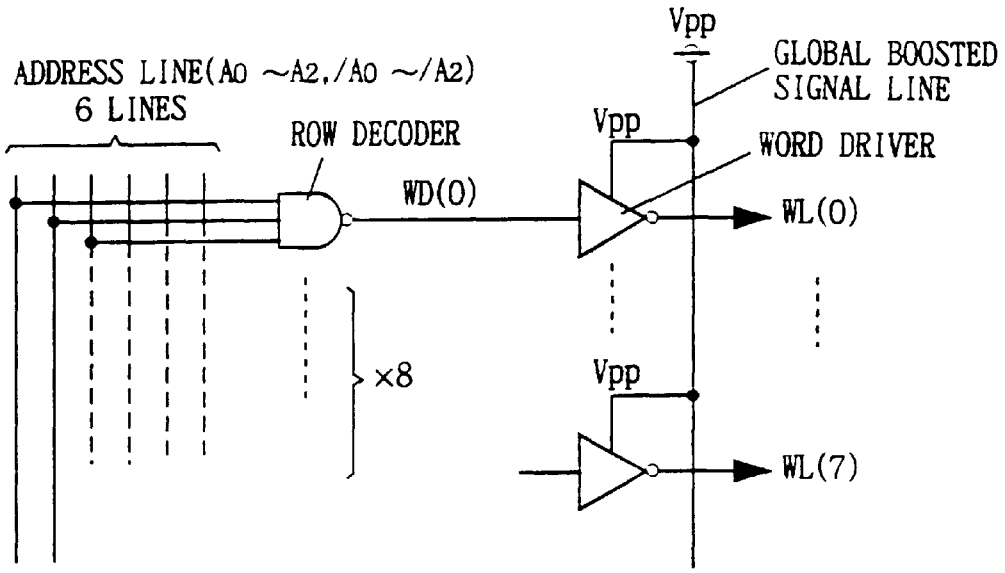
FIGS. 12A and 12B are diagrams for describing the effect of the seventh embodiment of FIG. 10.
Figure 12B:
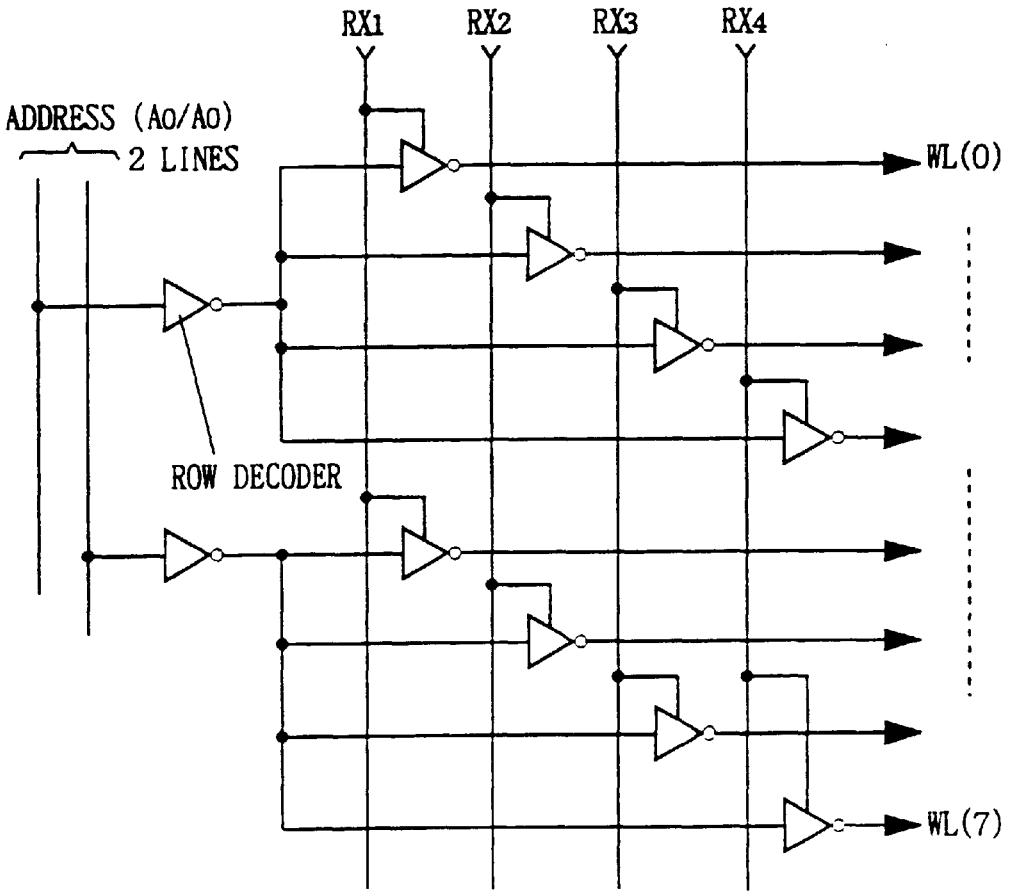

FIGS. 12A and 12B are diagrams for describing reduction in the chip area of a row decoder according to the seventh embodiment of FIG. 10. Particularly, FIG. 12A shows the provision of boosted potential $V_{PP}$ from a global boosted signal line to the word driver formed of a CMOS inverter shown in FIG. 26, and FIG. 12B shows the provision of boosted potential $V_{PP}$ to the word driver formed of a CMOS structure of FIG. 10 by a boosted decode signal $RX_{ik}$.

FIGS. 12A and 12B show the case where one out of the eight word lines (WL<0>–WL<7>) are selected. In FIG. 12A, eight input signals WD are required for the eight word drivers. Therefore, the row decoders require eight 3 NAND gates. Furthermore, address signals must be decoded with signals A0–A2, so that 6 address lines are required including inversion signals /A0–/A2. In contrast, in FIG. 12B, only two signals ZWD are required for the eight word drivers from the row decoder. Therefore, only two row decoders are required. Because the row decoder is not a 3 NAND gate, it can be formed by an inverter, and the circuit area required for the row decoder is reduced.

Figure 13:
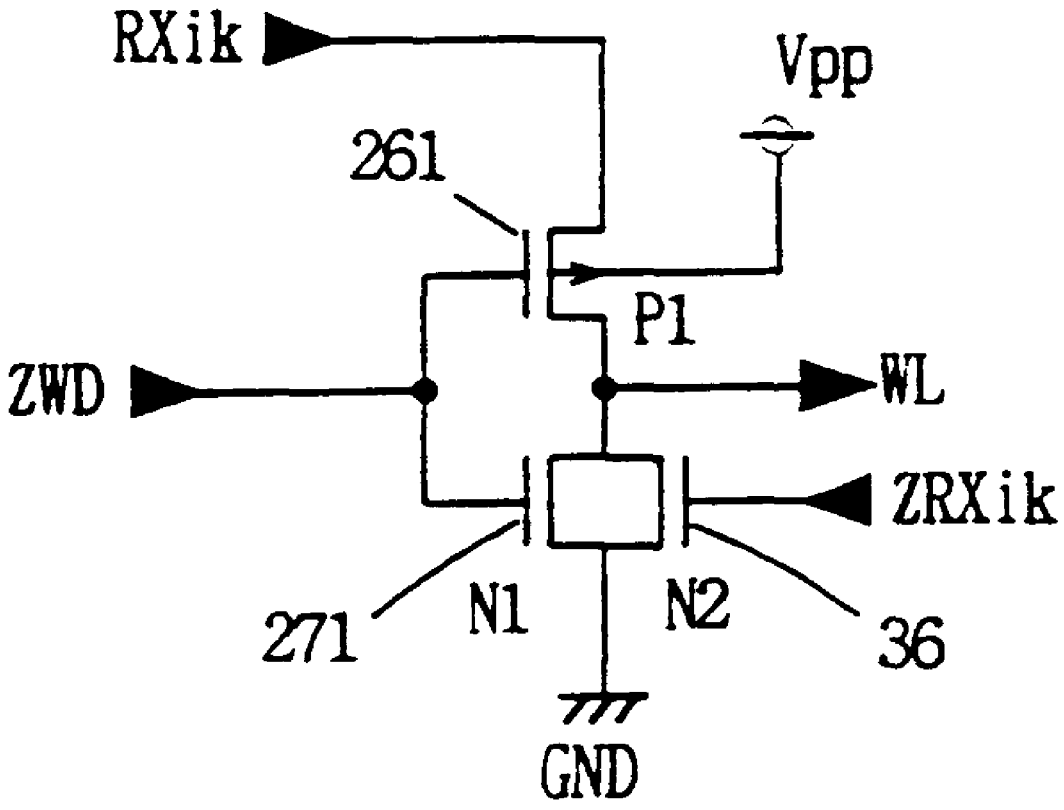
FIG. 13 is a circuit diagram showing a word driver of a semiconductor memory device according to an eighth embodiment of the present invention.

FIG. 13 is a circuit diagram of a word driver of a semiconductor memory device according to an eighth embodiment of the present invention. Only the components differing from those of the embodiment shown in FIG. 10 will be described hereinafter.

Referring to FIG. 13, an n channel MOS transistor 36 is connected parallel to n channel MOS transistor 271 connected to ground potential GND. Also, the gate of n channel MOS transistor 36 is supplied with an inversion signal $ZRX_{ik}$ of boosted decode signal $RX_{ik}$.

First, the problems of the embodiments shown in FIG. 10 will be described. When signal ZWD attains a L level (select state) and boosted decode signal $RX_{ik}$ attains a L level (de-select state), p channel MOS transistor 261 and n channel MOS transistor 271 both attain an off state, and the word line WL attains a floating state of a L level.

Therefore, by applying inversion signal $ZRX_{ik}$ of boosted decode signal $RX_{ik}$ to the gate of n channel MOS transistor 36, word line WL can be pulled to the level of ground potential GND at a de-select state. Particularly, when signal ZWD attains a L level (select state) and a boosted decode signal RX attains a L level (de-select state), word line WL attains a de-select state. Therefore, the application of inversion signal $ZRX_{ik}$ of a H level (de-select state) to n channel MOS transistor 36 causes n channel MOS transistor 36 to be turned on, whereby word line WL can be pulled down to the level of ground potential GND.

In addition to the effect of the embodiment shown in FIG. 10, the embodiment of FIG. 13 provides the advantage that a floating state of word line WL when boosted decode signal $RX_{ik}$ attains a L level (de-select state) can be suppressed, so that damage of data stored in a memory cell caused by a rise in the charge of the word line by noise or the like can be suppressed.

Figure 14:
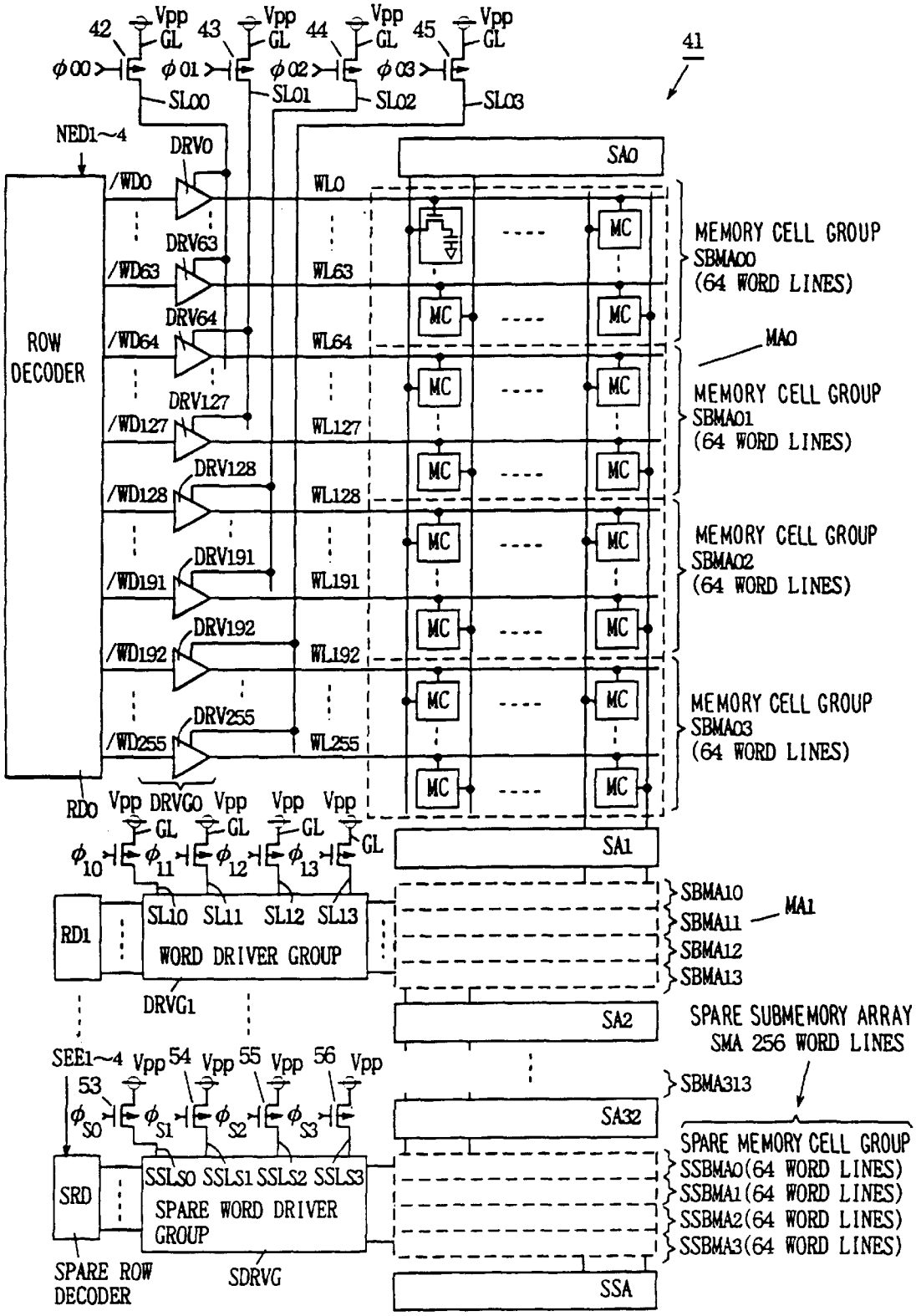
FIG. 14 is a block diagram of a semiconductor memory device according to a ninth embodiment of the present invention.
Figure 15:
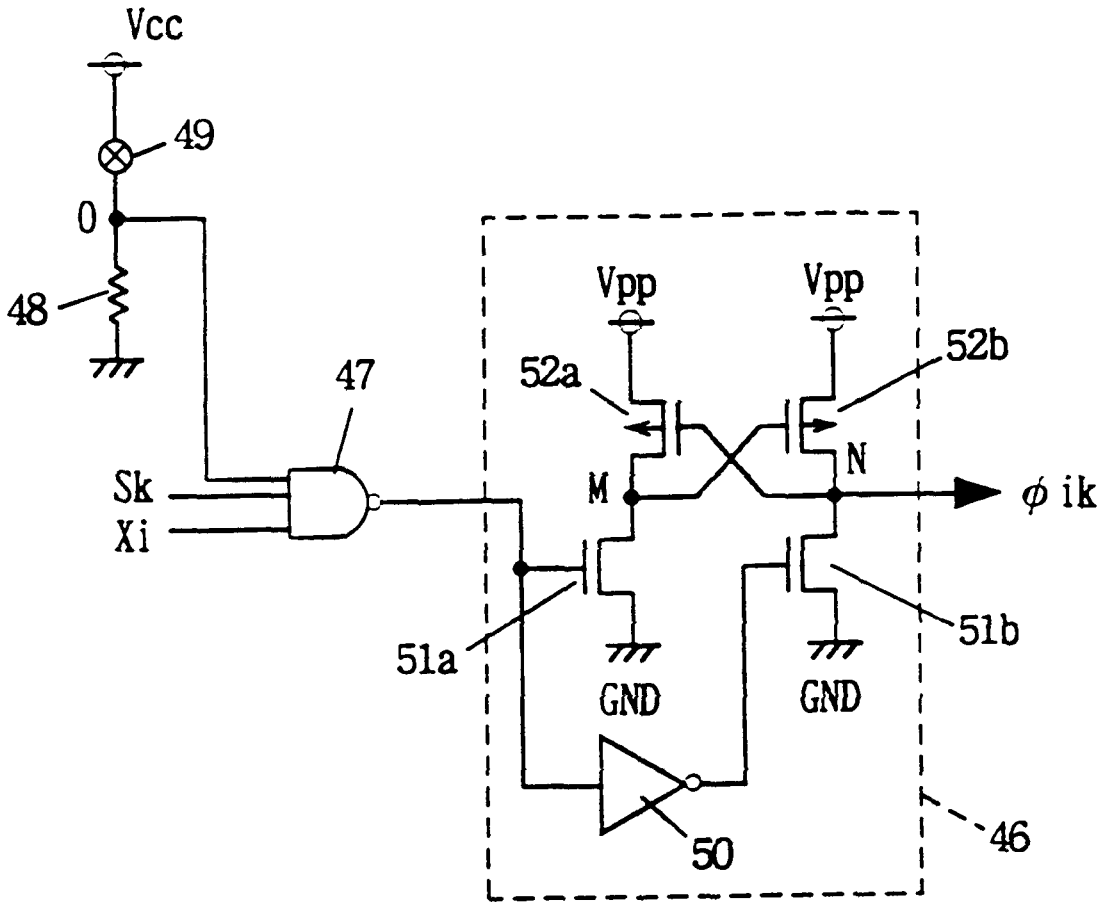
FIG. 15 shows a circuit for generating a control signal $\phi_{ik}$ which is applied to the switching transistor of FIG. 14.

FIG. 14 is a block diagram schematically showing a semiconductor memory device according to a ninth embodiment of the present invention. FIG. 15 shows a circuit generating a control signal $\phi_{ik}$ (i=0, 1, . . . , 31, k=0, 1, 2, 3) of the switching transistor of FIG. 14.

Referring to FIG. 14, semiconductor memory device 41 includes a plurality of submemory arrays $MA_i$ (i=0, 1, . . . , 31), a row decoder $RD_i$ (i=0, 1, . . . , 31) provided at one side of each submemory array $MA_i$, a word driver group $DRVG_0$ having word drivers $DRV_0$–$DRV_{255}$ provided at word lines $WL_0$–$WL_{255}$ arranged corresponding to each submemory array $MA_i$, a segment boosted signal line $SL_{ik}$ (i=0, 1, . . . , 31, k=0, 1, 2, 3) connected to any of word drivers $DRV_0$–$DRV_{255}$, a global boosted signal line GL, a switching transistor connected between global boosted signal line GL and segment boosted signal line $SL_{ik}$, and sense amplifier bands $SA_0$–$SA_{32}$.

Each memory array $MA_i$ is divided into a plurality of memory cell groups SBMA. For example, memory array $MA_0$ is divided into a memory cell groups $SBMA_{00}$ corresponding to word lines $WL_0$–$WL_{63}$, a memory cell group $SBMA_{01}$ corresponding to word lines $WL_{64}$–$WL_{127}$, a memory cell group $SBMA_{02}$ corresponding to word lines $WL_{128}$–$WL_{191}$, and a memory cell group $SBMA_{03}$ corresponding to word lines $WL_{192}$–$WL_{255}$. Similarly, memory array $MA_1$ is divided into memory cell groups $SBMA_{10}$, $SBMA_{11}$, $SBMA_{12}$ and $SBMA_{13}$. Memory array $MA_{31}$ is divided into memory cell groups $SBMA_{310}$, $SBMA_{311}$, $SBMA_{312}$, and $SBMA_{313}$.

A word driver corresponding to each memory cell group $SBMA_{ik}$ is connected to the same segment boosted signal line. For example, word drivers $DRV_0$–$DRV_{63}$ corresponding to memory cell group $SBMA_{00}$ is connected to a segment boosted signal line $SL_{00}$. Word drivers $DRV_{64}$–$DRV_{127}$ corresponding to memory cell group $SBMA_{01}$ is connected to segment boosted signal line $SL_{01}$. Word drivers $DRV_{128}$–$DRV_{191}$ corresponding to memory cell group $SBMA_{02}$ are connected to a segment boosted signal line $SL_{02}$. Word drivers $DRV_{192}$–$DRV_{255}$ corresponding to memory cell group $SBMA_{03}$ are connected to a segment boosted signal line $SL_{03}$. Switching transistors 42, 43, 44 and 45 are provided between each of segment boosted signal lines $SL_{00}$, $SL_{01}$, $SL_{02}$ and $SL_{03}$ and global boosted signal line GL.

As shown in FIG. 15, a circuit for generating a control signal $\phi_{ik}$ which is applied to the gate electrode of each switching transistor includes a level conversion unit 46, a 3 NAND gate 47, a fuse 49, and a resistor 48. Fuse 49 is connected between power supply potential $V_{CC}$ and a node O. Resistor 48 is connected between node O and ground potential GND. The output from node O is applied to 3 NAND gate 47. A memory array select signal $x_i$ (i=0, 1, . . . , 31) and sub memory array select signal $s_k$ (k=0, 1, 2, 3) are applied to the other inputs of 3 NAND gate 47. The output of 3 NAND gate 47 is applied to level conversion unit 46.

Level conversion unit 46 includes an inverter 50 corresponding to inverter 14 of level conversion unit 101 of FIG. 2, n channel MOS transistors 51*a* and 51*b* corresponding to n channel MOS transistors 15*a* and 15*b*, respectively, and p channel MOS transistors 52*a* and 52*b* corresponding to p channel MOS transistors 16*a* and 16*b*, respectively. n channel MOS transistors 51*a* and 51*b* and p channel MOS transistors 52*a* and 52*b* are connected with node M as node A and node N as node B. Thus, control signal $\phi_{ik}$ is output from node N.

When fuse 49 shown in FIG. 15 is not blown out, and sub memory array select signal $s_k$ and memory array select signal $x_i$ both attain a H level, the output of 3 NAND gate 47 attains a L level. Control signal $\phi_{ik}$ which is the output of level conversion unit 46 is applied to a switching transistor by boosted potential $V_{PP}$ of a H level. As a result, that switching transistor is rendered conductive. When switching transistor 42, for example, is rendered conductive, word drivers $DRV_0$–$DRV_{63}$ are driven to select memory cell group $SBMA_{00}$. Thus, memory array $MA_i$ separated by sense amplifier bands $SA_0$–$SA_{32}$ is further divided into four regions. Therefore, a sub memory array select signal $s_k$ is required.

There are cases when memory cell group SBMA must be exchanged by some reason. Therefore, semiconductor memory device 41 includes a spare memory array SMA, a spare row decoder SRD provided at one side of spare memory array SMA, a word driver group SDRVG having a spare word driver provided at each spare word line corresponding to spare memory array SMA, a spare segment signal boosted line $SSL_{sk}$ (k=0, 1, 2, 3) connected to a spare word driver, switching transistors 53, 54, 55 and 56 connected between global boosted signal line GL and spare segment signal line $SSL_{sk}$, and spare sense amplifier band SSA.

Spare memory array SMA is divided into spare sub memory cell groups $SSBMA_0$–$SSBMA_3$ having a memory capacity equal to that of memory cell group $SBMA_{ik}$ of memory array MA. When 256 word lines are provided in spare memory array SMA, there are spare memory cell groups $SSBMA_0$, $SSBMA_i$, $SSBMA_2$, and $SSBMA_3$ for every 64 word lines. A word driver corresponding to each of spare memory cell groups $SSBMA_0$–$SSBMA_3$ is connected to spare segment boosted signal lines $SSL_{s0}$, $SSL_{s1}$, $SSL_{s2}$, and $SSL_{s3}$. For example, all spare word drivers corresponding to spare memory cell group $SSBMA_0$ is connected to spare segment boosted signal line $SSL_{s0}$.

Switching transistors 53, 54, 55 and 56 are provided between each of spare segment boosted signal lines $SSL_{s0}$, $SSL_{01}$, $SSL_{s2}$, and $SSL_{s3}$ and global boosted signal line GL. Control signal $\phi_{si}$ applied to the gate electrode of each of switching transistors 53, 54, 55 and 56 is a control signal corresponding to a memory cell group $SBMA_{ik}$ to be exchanged.

In order to use spare memory cell group SSBMA, fuse 49 of FIG. 15 corresponding to memory cell group $SBMA_{ik}$ to be exchanged is blown out. This blow out of fuse 49 causes the output of 3 NAND gate 47 to be pulled up to a H level and control signal $\phi_{ik}$ to a L level regardless of the level of sub memory array select signal $s_k$ and memory array select signal $x_i$. Control signal $\phi_{ik}$ is applied to a switching transistor corresponding to the to-be-exchanged sub memory array $SBMA_{ik}$ to be turned off. As a result, memory cell group $SBMA_{ik}$ is not used, and spare memory cell group SSBMA is used instead.

Because the word drivers belonging to memory array MA divided by sense amplifier band SA are not all connected to the same segment boosted signal line, the $V_{PP}$ generation circuit not shown does not have to provide boosted voltage $V_{PP}$ as long as control signal $\phi_{00}$ does not render conductive switching transistor 49 even when leakage occurs is segment voltage signal line $SL_{00}$. As a result, consumed current is suppressed. Even in the case of a sub threshold leakage or junction leakage instead of leakage in segment boosted signal line $SL_{ik}$, the generation is limited only in the transistor belonging to the selected segment boosted signal line. Therefore, the leakage current is suppressed in comparison with the case where the word drivers are connected to the same segment boosted signal line.

Because spare memory array SMA is divided by spare memory cell group $SSBMA_k$, it is not necessary to carry out exchange at the unit of memory arrays. Exchange of one memory cell group SBMA is carried out with a spare memory cell group SSBMA, so that the exchange efficiency is improved. Furthermore, because it is not necessarily required to divide spare memory array SMA into a plurality of spare memory cell groups SSBMA, the chip area can be suppressed.

More specifically, in the present seventh embodiment, four segment boosted signal lines are provided for one memory array, wherein each memory array is divided into four memory cell groups according to word lines connected to a switching transistor corresponding to each segment boosted signal line. Therefore, a spare memory cell group can be substituted at a memory cell group unit that is smaller than the unit of the first embodiment in which a spare memory array is substituted for a memory array. Therefore, the exchange efficiency can be improved in comparison with that of the first embodiment with the same spare memory array size. For example, when each first memory cell group is defective in the first and second memory arrays, the semiconductor memory device will become defective in the first embodiment because the second memory array cannot be substituted since there is only one spare memory array. In contrast, the seventh embodiment can have the two defective memory cell groups substituted with two spare memory cell groups. Therefore, this semiconductor memory device can be repaired.

If the chip area must be reduced, the number of the spare memory cell groups should be reduced although the exchange efficiency will be degraded. The exchange efficiency and chip area depends upon how many portions a memory array is divided into, and how many spare memory cell groups are provided. Selection is to be carried out for an optimum value from the standpoint of exchange efficiency and chip area.

In the semiconductor memory device of FIG. 14, word lines are locally fixed depending on to which of the four segment boosted signal lines it corresponds to, and in which of the four memory cell groups it is included. Alternatively, word lines may be disposed so that every fourth word lines are included in the same memory cell groups as in the case where word lines $WL_0$, $WL_4$, $WL_8$, . . . are included in one memory cell group, word lines $WL_1$, $WL_5$, $WL_9$ are included in another memory cell group, and so on.

Figure 16:
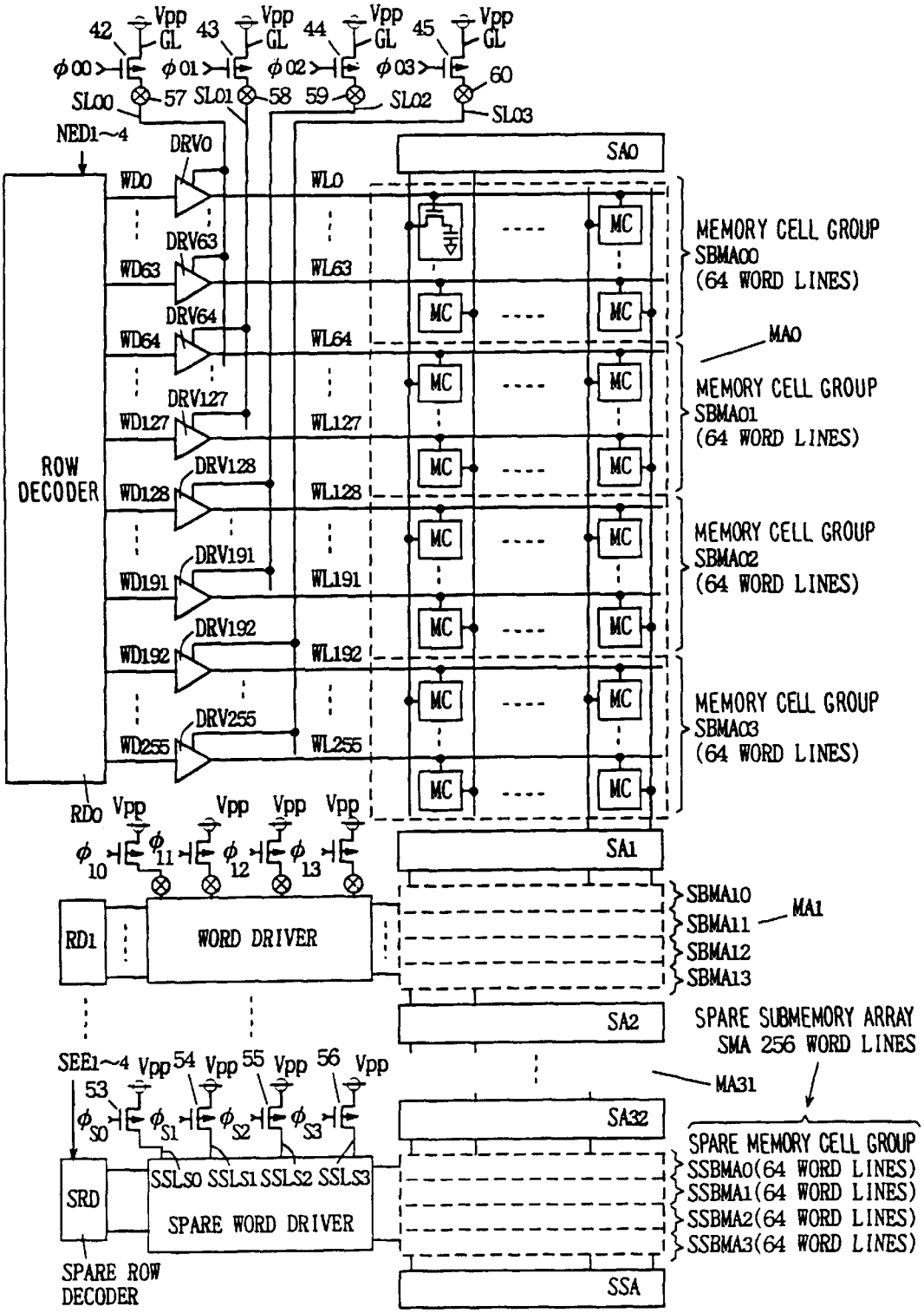
FIG. 16 is a block diagram of a semiconductor memory device according to a tenth embodiment of the present invention.
Figure 17:
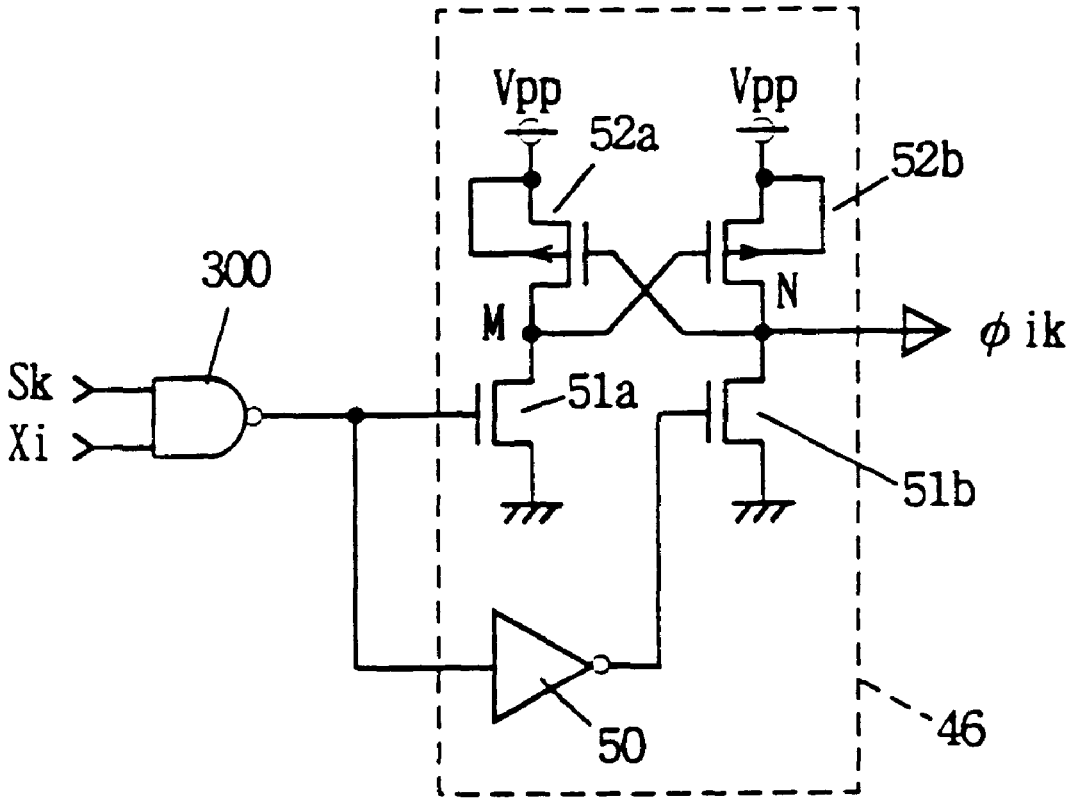
FIG. 17 shows a circuit for generating a control signal $\phi_{ik}$ applied to the switching transistor of FIG. 16.

FIG. 16 is a block diagram Schematically showing a semiconductor memory device according to a tenth embodiment of the present invention. FIG. 17 shows a circuit for generating a control signal $\phi_{ik}$ (i=0, 1, . . . , 31, k=0, 1, 2, 3) of a switching transistor. Only the components differing from those of the ninth embodiment shown in FIGS. 14 and 15 will be described hereinafter.

In the present tenth embodiment, a fuse is provided in each segment boosted signal line $SL_{ik}$ (i=0, 1, . . . , 31, k=0, 1, 2, 3) to disconnect global boosted signal line GL from segment boosted signal line $SL_{ik}$. For example, fuses 57, 58, 59 and 60 are provided in segment boosted signal lines $SL_{00}$, $SL_{01}$, $SL_{02}$, and $SL_{03}$, respectively, connected to switching transistors 42, 43, 44 and 45, respectively. Each of fuses 57, 58, 59 and 60 carry out a function corresponding to fuse 49 of FIG. 15. Also, instead of 3 NAND gate 47 of FIG. 15, NAND gate 300 of FIG. 17 receives sub memory array select signals $S_k$ and memory array select signal $x_i$. Control signal $\phi_{ik}$ controlling a switching transistor is generated by the circuit shown in FIG. 17.

A fuse corresponding to a memory cell group $SBMA_{ik}$ (i=0, 1, . . . , 31, k=0, 1, 2, 3) to be exchanged is blown out, and exchange is carried out by a spare cell group SSBMA.

In the present tenth embodiment, the word drivers belonging to a submemory array are not all connected to the same segment boosted signal line. Therefore, the $V_{PP}$ generation circuit not shown does not operate to pull up the leaking segment boosted signal line to the level of boosted voltage $V_{PP}$ as long as the switching transistor that raises the one segment boosted signal line to the level of boosted potential is not rendered conductive when one of the four segment boosted signal lines shows leakage. Therefore, consumed current is suppressed. Furthermore, the sub threshold leakage or junction leakage is limited to be generated only in the transistor belonging to the selected segment boosted signal line. Thus, leakage current is suppressed in comparison with the case where all the word drivers are connected to the same segment boosted signal line. Furthermore, the exchange efficiency is improved and the chip are is reduced in comparison with the case of the first embodiment shown in FIG. 1.

Each of fuses 57, 58, 59 and 60 operate in a manner similar to that of fuse 220 of the fifth embodiment of FIG. 7. More specifically, each of fuses 57, 58, 59 and 60 are connected between switching transistors 42, 43, 44 and 45 and segment boosted signal lines $SL_{00}$, $SL_{01}$, $SL_{02}$, and $SL_{03}$, respectively. By blowing out a fuse corresponding to a memory cell group to be exchanged, a global boosted signal line can be completely and easily disconnected from a segment boosted signal line regardless of the conduction or nonconduction of that switching transistor. Furthermore, such a disconnection eliminates the need of a circuit for generating a control signal $\phi_{ik}$ that is shown in FIG. 15. Only a simple circuit as that shown in FIG. 17 is required.

An eleventh embodiment will be described hereinafter.

In the ninth embodiment shown in FIG. 14, a switching transistor is provided corresponding to each memory cell group SBMA and spare memory cell group SSBMA. It is considered that the embodiments shown in FIGS. 1–6 may be applied to a switching transistor. The present eleventh embodiment is an application of the fourth embodiment of FIG. 5 to the switching transistor provided corresponding to each memory cell group SBMA and spare memory cell group SSBMA in the ninth embodiment shown in FIG. 14.

The first embodiment shown in FIG. 1, the second embodiment shown in FIG. 3, the third embodiment shown in FIG. 4, and the fourth embodiment shown in FIG. 5 relate to the provision of a predetermined potential between a boosted potential and the ground potential to a word driver. By applying such an embodiment to the ninth embodiment of FIG. 14, a semiconductor memory device is provided that carries out an operation at a higher speed. In this case, not only access of high speed, but also leakage from a segment boosted signal line can be slightly compensated for according to the embodiment of FIG. 5. Therefore, the memory cell group belonging to the segment boosted signal line compensated for the leakage does not have to be exchanged by a spare memory cell group. Therefore, the exchange efficiency is improved.

The chip area is as described in the ninth embodiment of FIG. 4. It may be considered that the chip area for the provision of each switching transistor in the circuit of FIG. 5 is increased. However, the chip area is greater for the spare memory cell group in comparison with a memory cell group corresponding to the circuit shown in FIG. 5. Therefore, it can be considered that the chip area is eventually reduced.

Thus, by applying the fourth embodiment of FIG. 5 into the ninth embodiment of FIG. 14, reduction in consumed current and the chip area, and also improvement in the exchange efficiency and access rate can be achieved.

Figure 18:
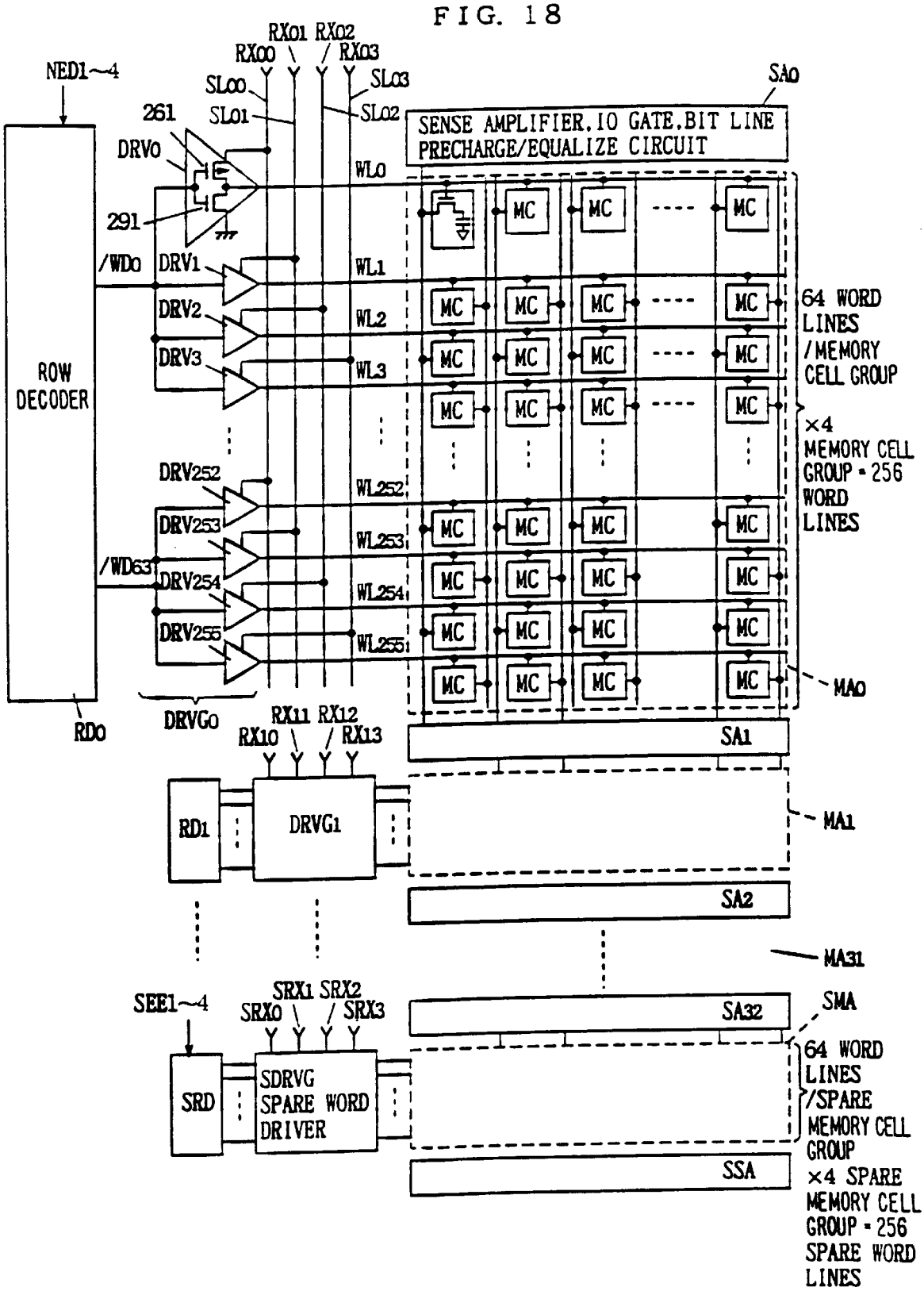
FIG. 18 is a block diagram schematically showing a semiconductor memory device according to a twelfth embodiment of the present invention.
Figure 19:
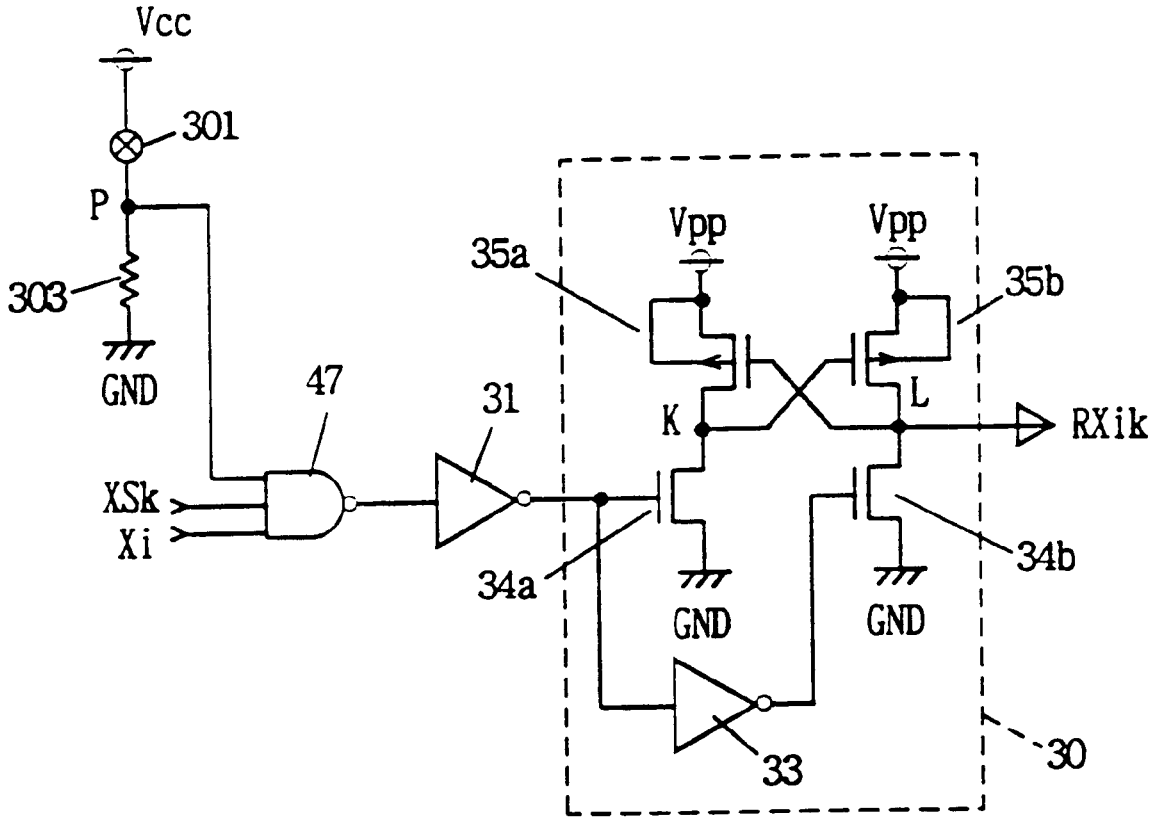
FIG. 19 shows a circuit for generating the boosted decode signal $RX_{ik}$ of FIG. 18.

FIG. 18 is a block diagram schematically showing a semiconductor memory device according to a twelfth embodiment of the present invention. FIG. 19 shows a circuit for generating a boosted decode signal $RX_{ik}$ (i=0, 1, . . . , 31, k=0, 1, 2, 3). In the following, components differing from those shown in the ninth embodiment of FIG. 14 and the circuit shown in FIG. 11 will be described.

Referring to FIG. 18, a boosted decode signal $RX_{ik}$ (i=0, 1, . . . , 31, k=0, 1, 2, 3) is used instead of boosted potential $V_{PP}$, switching transistors 42, 43, 44 and 45, and control signal $\phi_{ik}$ in FIG. 14. In comparison with the embodiment shown in FIG. 14 where each group of 64 word lines is connected to the same segment boosted signal line, the present twelfth embodiment has every fourth word lines arranged in the same memory cell group. For example, word lines $WL_0$, $WL_4$, $WL_8$, . . . are included in one memory cell group, and word lines $WL_1$, $WL_5$, $WL_9$, . . . are included in another memory cell group. Therefore, one memory array includes four memory cell groups. This means that the concept of a memory cell group is not one that is divided substantially as that shown in FIG. 14, and corresponds to a more higher concept level.

The output signals of row decoder $RD_0$ are not the 252 signals of $/WD_0$–$WD_{255}$, but 63 signals of $/WD_0$–$/WD_{63}$. More specifically, the same signal of $/WD_0$ is applied to word drivers $DRV_0$–$DRV_3$ provided in word lines $WL_0$–$RL_3$, respectively. For word drivers $DRV_{252}$–$DRV_{255}$ provided in word lines $WL_{252}$–$WL_{255}$, respectively, the same signal of $/WD_{63}$ is applied. Word drivers $DRV_0$–$DRV_{255}$ are word drivers shown in the seventh embodiment of FIG. 10.

Word drivers $DRV_0$–$DRV_{255}$ are set as a word driver group $DRVG_0$. A word driver group $DRVG_i$ (i=1, 2, . . . , 31) is provided with respect to another memory array $MA_i$ (i=1, 2, . . . , 31). Similarly, spare memory array SMA is divided into four spare memory cell groups. A spare row decoder SRD and a spare word driver group SDRVG are also provided. Boosted decode signals $SRX_0$, $SRX_1$, $SRX_2$, and $SRX_3$ are applied to spare word driver group SDRVG.

In order to exchange the spare memory cell group of spare memory array SMA with the memory cell group of sub-memory array MA, a fuse 301 and a resistor 303 as shown in FIG. 19 are provided with respect to the circuit generating boosted decode signal $RX_{ik}$ of FIG. 11. Fuse 301 is connected between power supply potential $V_{CC}$ and a node P. Resistor 303 is connected between ground potential GND and node P. By blowing out fuse 301 regardless of the level of predecode signal $x_{sk}$ and memory array select signal $x_i$, boosted decode signal $RX_{ik}$ is fixed at a L level. Therefore, the word line of a memory cell group belonging to boosted decode signal $RX_{ik}$ fixed to a L level is not activated. The no-longer used memory cell group is exchanged with a spare memory cell group.

In the present embodiment, the memory array is divided into sub memory arrays, and the spare memory array is divided into spare sub memory arrays. Therefore, effects identical to those of the ninth embodiment of FIG. 14 and the tenth embodiment of FIG. 16 can be obtained regarding the exchange efficiency and chip area.

Furthermore, because a word driver according to the seventh embodiment shown in FIG. 10 is used as a word driver, high speed access is possible on account of reduction of the circuit complexity of the row decoder and boosted decode signal $RX_{ik}$ that does not have to be delayed.

Figure 20:
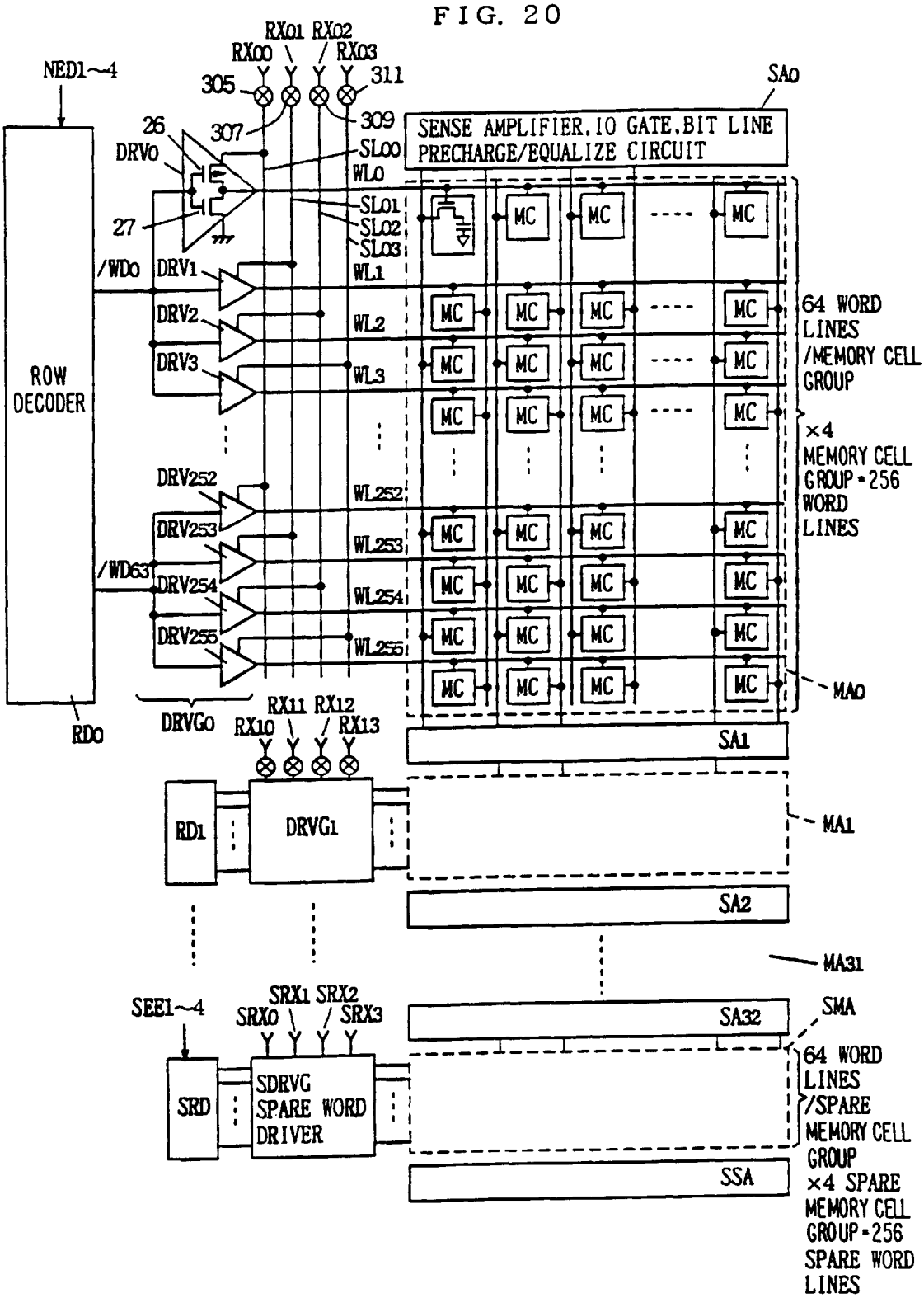
FIG. 20 is a block diagram schematically showing a semiconductor memory device according to a thirteenth embodiment of the present invention.
Figure 21:
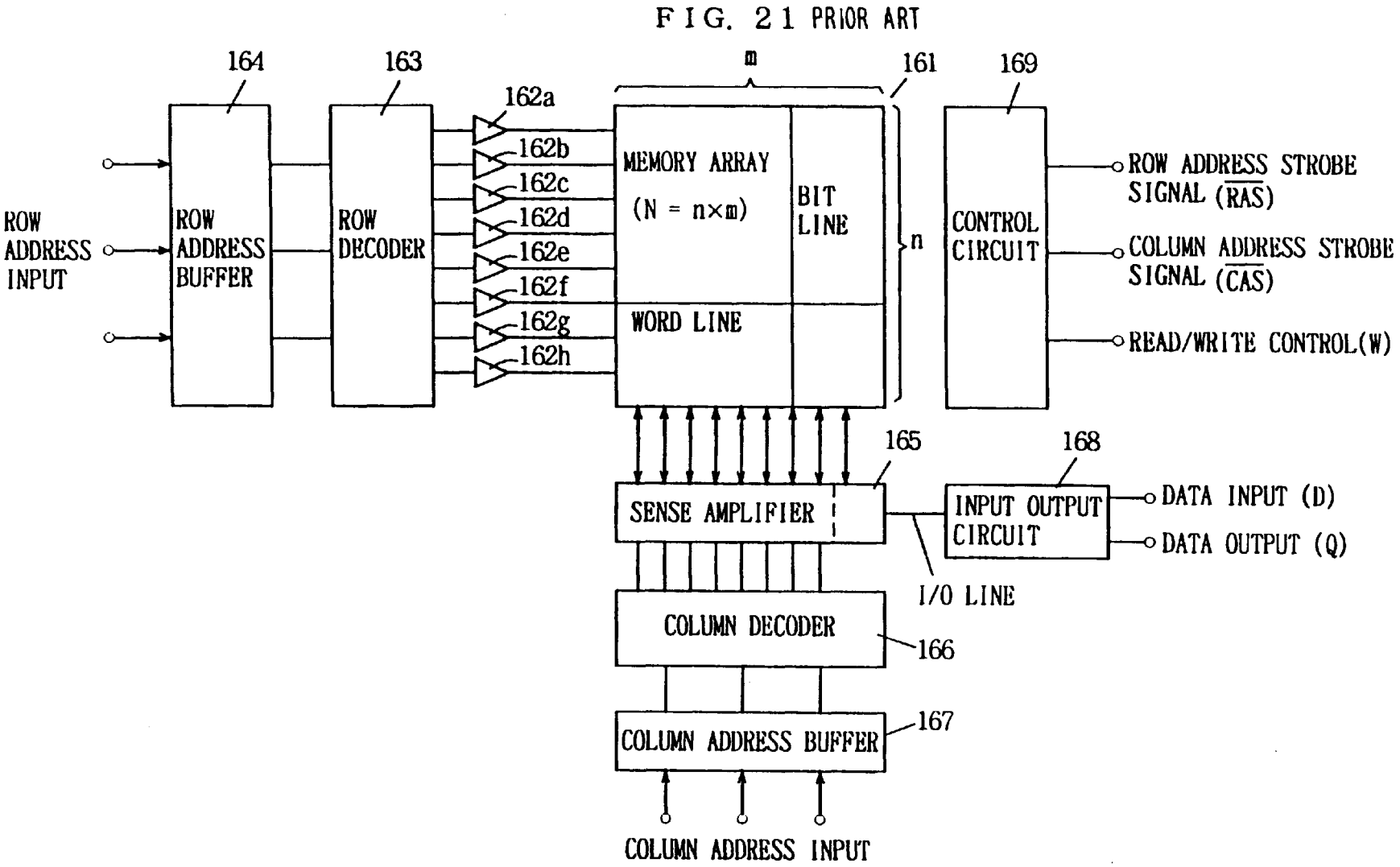
FIG. 21 PRIOR ART
FIG. 21 is a block diagram schematically showing a conventional semiconductor memory device.
Figure 22:
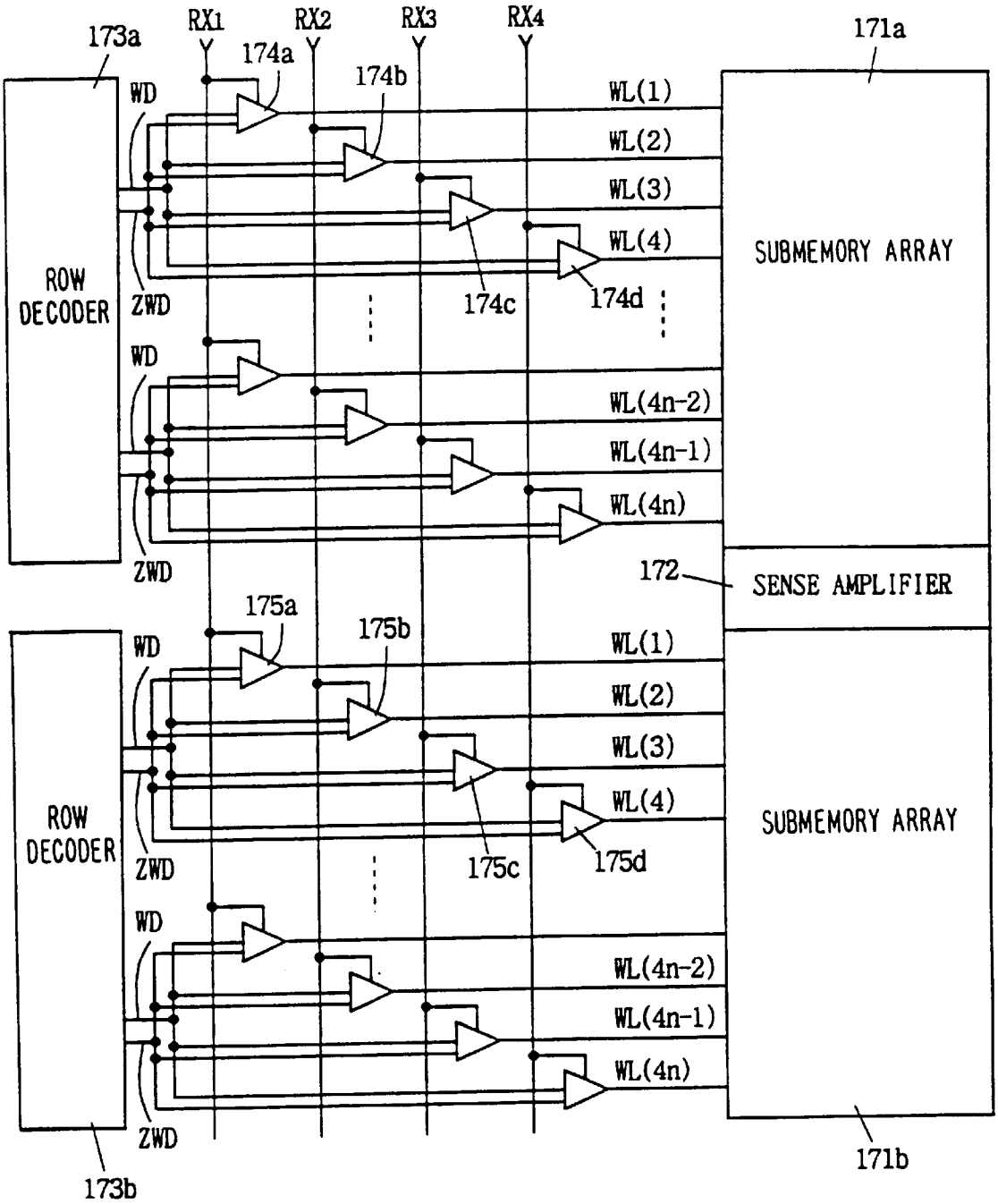
FIG. 22 PRIOR ART
FIG. 22 is a block diagram of FIG. 21 showing the main components enlarged.
Figure 23:
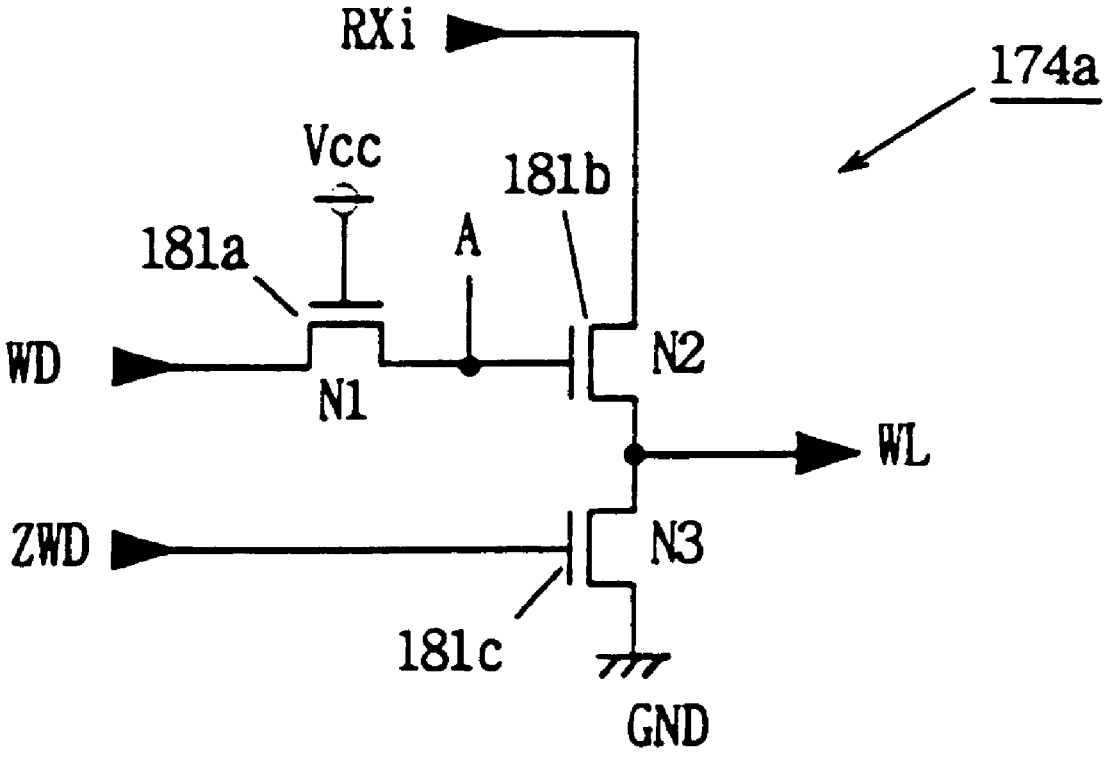
FIG. 23 PRIOR ART
FIG. 23 is a circuit diagram of the word driver of FIG. 22.
Figure 24:
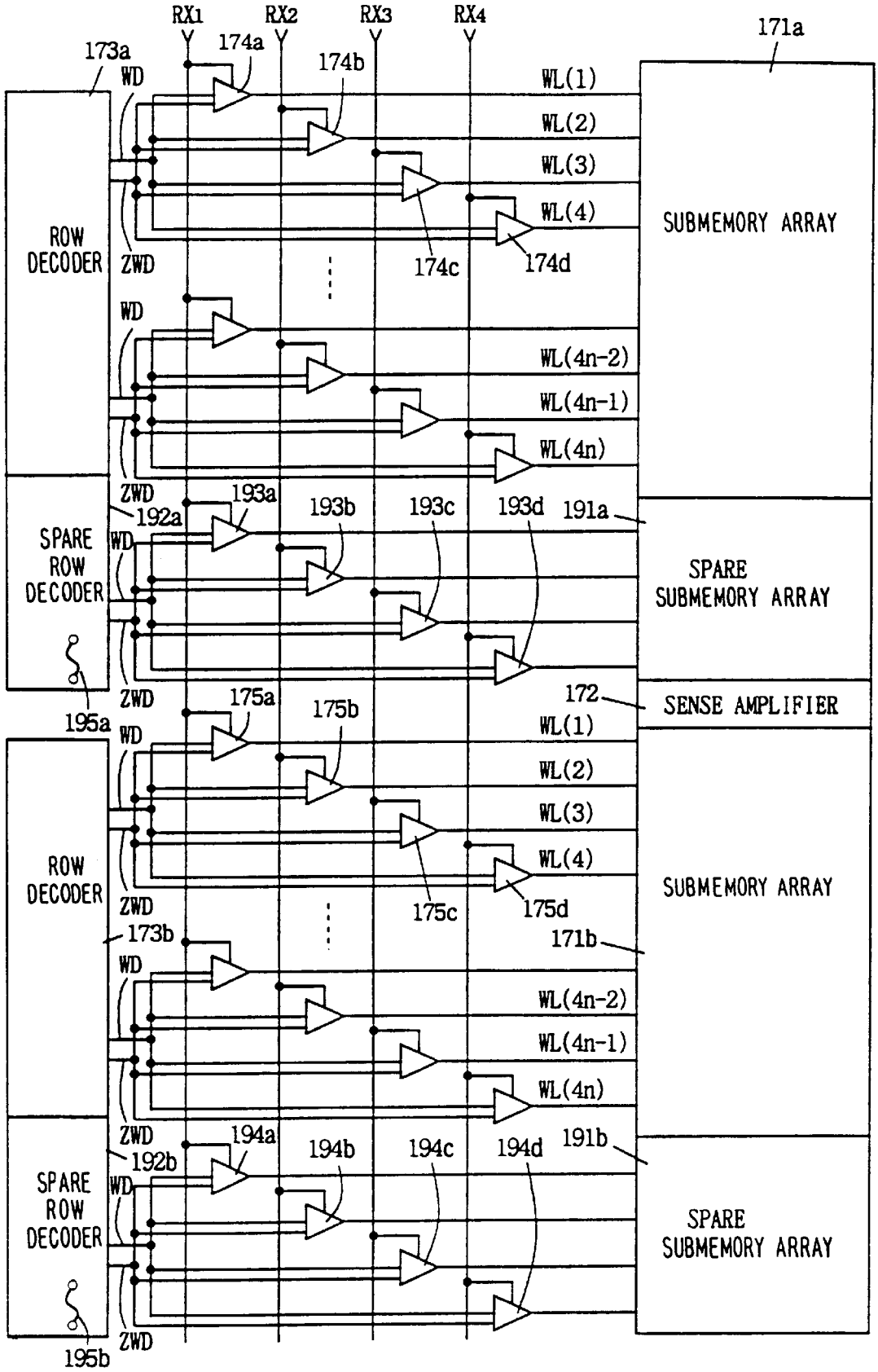
FIG. 24 PRIOR ART
FIG. 24 shows an additional provision of a spare submemory array for exchanging a defective memory cell in the submemory array of FIG. 22.
Figure 25:
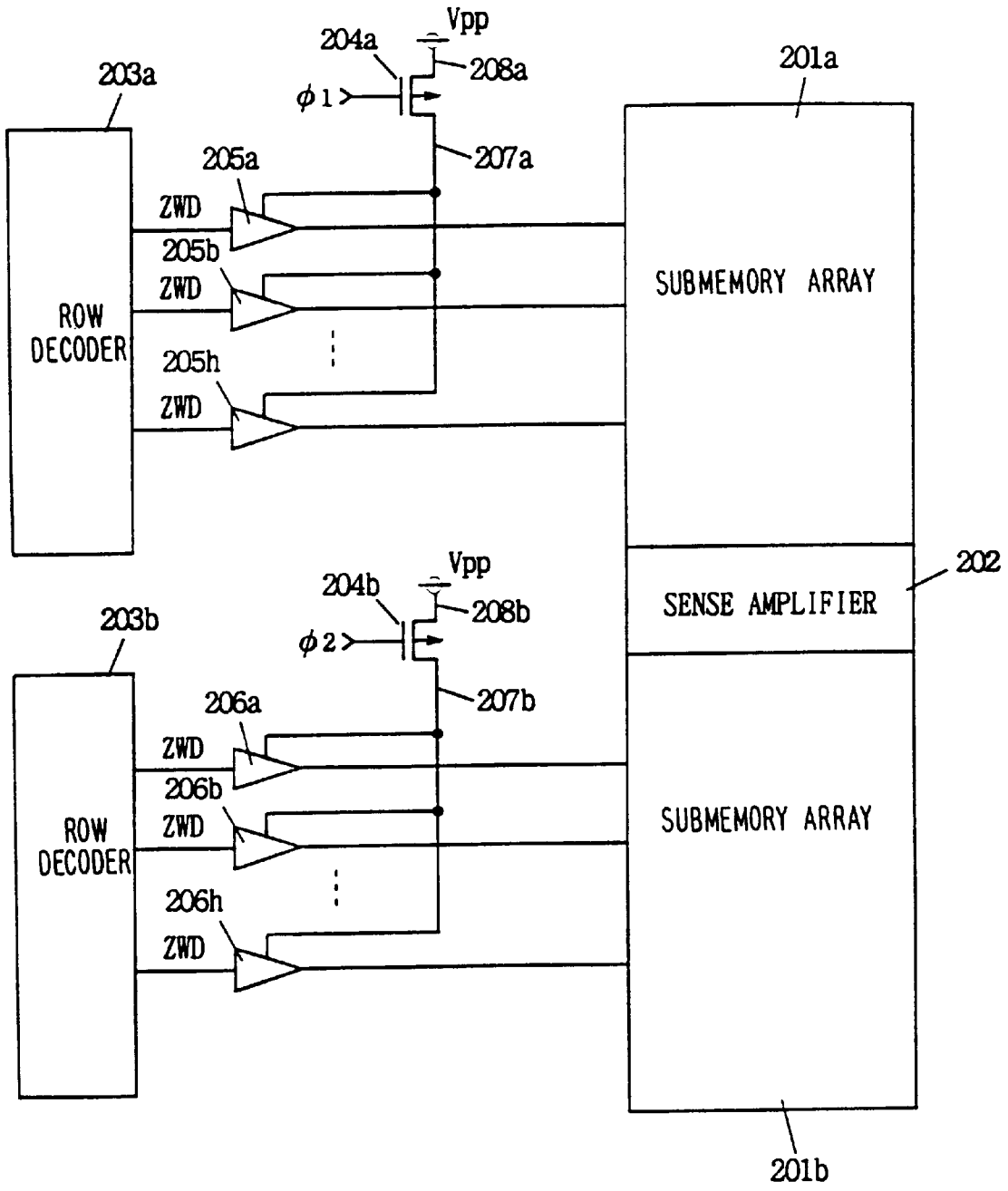
FIG. 25 PRIOR ART
FIG. 25 is a block diagram of another conventional semiconductor memory device.

FIG. 20 is a block diagram schematically showing a semiconductor memory device according to a thirteenth embodiment of the present invention. Components differing from those of the twelfth embodiment of FIG. 18 will be described.

A fuse is provided at each segment boosted signal line $SL_{ik}$ (i=0, 1, . . . , 31, k=0, 1, 2, 3) shown in FIG. 19. More specifically, a fuse 305 is provided at segment boosted signal line $SL_{00}$, a fuse 307 is provided at segment boosted signal line $SL_{01}$, a fuse 309 is provided at segment boosted signal line $SL_{02}$, and a fuse 311 is provided at segment boosted signal line $SL_{03}$. These fuses 305, 307, 309 and 311 carry out a function identical to that of fuse 301 of FIG. 19. The effects of the present thirteenth embodiment are similar to those of the twelfth embodiment of FIG. 18. In addition, the circuit for generating boosted decode signal $RX_{ik}$ is simplified as that shown in FIG. 11. Therefore, the circuit structure is further simplified.

The word driver of the thirteenth embodiment of FIG. 13 may be applied to a semiconductor memory device of FIGS. 18 and 20. In this case, the effects such as reduction in the chip area of a space memory and a row decoder, improvement in the exchange efficiency and access rate, suppression of floating, and reduction of consumed current can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a submemory array having a plurality of memory cells connected to a plurality of word lines, a global boosted line to which a boosted potential higher than a power supply potential is supplied, a segment boosted line provided corresponding to said submemory array, word line select means for selecting any of said plurality of word lines, word line activation means responsive to an output from said word line select means for providing the potential of said segment boosted line to a selected one of said plurality of word lines to activate the same, first switching means connected between said segment boosted line and said global boosted line for selecting an electrical connection of said segment boosted line with said global boosted line, and potential maintaining means for maintaining the potential of said segment boosted line at a potential between ground potential and said boosted potential provided to said global boosted line.

2. The semiconductor memory device according to claim 1, further comprising detection means for detecting the potential level of boosted potential applied to said global boosted line, wherein said potential maintaining means comprises resistor means connected parallel to said first switching means, and second switching means connected in series with said resistor means for selecting an electrical connection of said segment boosted line with said global boosted line via said resistance means according to a detection output of said detection means.

3. The semiconductor memory device according to claim 1, wherein said potential maintaining means comprises a node to which a potential is provided between boosted potential supplied to said global boosted line and ground potential, and diode means connected between said node and said segment boosted line.

4. The semiconductor memory device according to claim 3, wherein said potential maintaining means comprises fuse means connected in series with said diode means.

5. A semiconductor memory device comprising:

a [memory] *submemory* array having a plurality of [sub-memory] *memory* cells connected to a plurality of word lines, a global boosted line to which a boosted potential higher than a power supply potential is supplied, a segment boosted line provided corresponding to said submemory array, a row decoder for selecting any of said plurality of word lines, a plurality of word drivers, each connected between said segment boosted line and each of said plurality of word lines, wherein each of said plurality of word drivers comprises a first conductivity type transistor connected between said segment boosted line and a word line corresponding to each of said plurality of word drivers, and having a control electrode supplied with an output of said row decoder, a second conductivity type transistor having a first electrode connected to said corresponding word line, a second electrode supplied with ground potential, and a control electrode supplied with an output of said row decode, a switching transistor connected between said segment boosted line and said global boosted line for being turned on/off according to a control signal applied to the control electrode thereof, control signal generating means for generating a control signal applied to the control electrode of said switching transistor, and potential maintaining means for maintaining the potential of said segment boosted line at a potential between ground potential and said boosted potential applied to said global boosted line.

6. The semiconductor memory device according to claim 5, wherein said first conductivity type transistor included in each of said plurality of word drivers comprises a first p channel MOS transistor having a gate electrode supplied with an output of said row decoder, said second conductivity type transistor included in each of said plurality of word drivers comprises an n channel MOS transistor having a gate electrode supplied with an output of said row decoder, said switching transistor comprises a second p channel MOS transistor having a gate electrode supplied with a control signal generated by said control signal generation means, and said potential maintaining means comprises a series element including a resistor and a fuse, connected between said global boosted line and said segment boosted line.

7. The semiconductor memory device according to claim 6, wherein said fuse of said series element is a fuse connected parallel to said second p channel MOS transistor.

8. The semiconductor memory device according to claim 6, wherein said fuse of said series element is a fuse connected in series with said second p channel MOS transistor.

9. The semiconductor memory device according to claim 5, wherein said first conductivity type transistor included in each of said plurality of word drivers comprises a first p channel MOS transistor having a gate electrode supplied with an output of said row decoder, said second conductivity type transistor included in each of said plurality of word drivers comprises an n channel MOS transistor having a gate electrode supplied with an output of said row decoder, said switching transistor comprises a second p channel MOS transistor having a gate electrode supplied with a control signal generated by said control signal generation means, said potential maintaining means comprises:

a power supply potential node to which a power supply potential is supplied, a series element including a diode element and a fuse, and connected between said power supply potential node and said segment boosted line [$SL_0$)].

10. The semiconductor memory device according to claim 9, wherein said fuse of said series element is a fuse having one end connected to said diode element and the other end connected to said second p channel MOS transistor and said segment boosted line.

11. The semiconductor memory device according to claim 9, wherein said fuse of said series element is a fuse having one end connected to said diode element and said second p channel MOS transistor, and the other end connected to said segment boosted line.

12. The semiconductor memory device according to claim 5, wherein said first conductivity type transistor included in each of said plurality of word drivers comprises a first p channel MOS transistor having a gate electrode supplied with an output of said row decoder, said second conductivity type transistor included in each of said plurality of word drivers comprises an n channel MOS transistor having a gate electrode supplied with an output of said row decoder, said switching transistor comprises a second p channel MOS transistor having a gate electrode supplied with a control signal generated by said control signal generation means, said potential maintaining means comprises a first series element including a resistor and a fuse, and connected between said global boosted line and said segment boosted line, a power supply potential node to which a power supply potential is supplied, and a second series element including a diode element and a fuse, and connected between said power supply potential node and said segment boosted line.

13. The semiconductor memory device according to claim 12, wherein said fuse of said second series element comprises a fuse having one end connected to said diode element and the other [element] *end* connected to said second p channel MOS transistor and said segment boosted line.

14. The semiconductor memory device according to claim 12, wherein said fuse of said second series element comprises a fuse having one end connected to said diode element and said second p channel MOS transistor, and the other end connected to said segment boosted line.

15. The semiconductor memory device according to claim 5, further comprising a detection circuit for detecting a potential level of a boosted potential applied to said global boosted line, wherein said first conductivity type transistor includes in each of said plurality of word drivers comprises a first p channel MOS transistor having a gate electrode supplied with an output of said row decoder, wherein said second conductivity type transistor included in each of said plurality of word drivers comprises an n channel MOS transistor having a gate electrode supplied with an output of said row decoder, wherein said switching transistor comprises a second p channel MOS transistor having a gate electrode supplied with a control signal generated by said control signal generation means, wherein said potential maintaining means comprises a resistor connected parallel to said second p channel MOS transistor, a p channel MOS transistor controlled according to a detected output of said detection circuit, connected in series with said resistor, and connected between said global boosted line and said segment boosted line via said resistor, a power supply potential node to which a power supply potential is supplied, a diode element connected between said power supply potential node and said segment boosted line, and a fuse connected in series with said diode element.

16. A semiconductor memory device comprising a word line activation means for activating a word line, wherein said word line activation means comprises a [first,] first conductivity type transistor having a control electrode applied with a row decode signal, and a first electrode supplied with a boosted decode signal, and a *first* second conductivity type transistor having a control electrode supplied with a row decode signal identical to said row [decoder] *decode* signal, and connected in series with said [first] first conductivity type transistor.

17. The semiconductor memory device according to claim [15] *16*, wherein said word line activation means comprises a second [first] *second* conductivity type transistor having a control electrode supplied with an inversion signal of said boosted decode signal, connected parallel to said first second conductivity type transistor.

18. A semiconductor memory device comprising a word driver for activating a word line, wherein said word driver comprises a first p channel MOS transistor having a gate electrode supplied with a row decode signal and a source electrode supplied with a boosted decode signal, and an n channel MOS transistor having a gate electrode supplied with a row decode signal identical to said row decode signal, and connected in series with said first p channel MOS transistor.

19. The semiconductor memory device according to claim 18, wherein said word driver comprises a second n channel MOS transistor having a gate electrode supplied with an inversion signal of said boosted decode signal, and connected parallel to said n channel MOS transistor.

20. A semiconductor memory device comprising a submemory array having a plurality of memory cells connected to a plurality of word lines, wherein said submemory array comprises a plurality of memory cell groups, each of said plurality of memory cell groups including a predetermined number of said plurality of word lines a plurality of segment boosted lines each provided corresponding to each memory cell group, to which a boosted potential high than a power supply potential is selectively applied, word line select means for selecting any of said plurality of word lines, and word line activation means responsive to an output of said word line select means for providing the potential of the segment boosted line to which said boosted potential is selectively applied to any of said predetermined number of word lines included in each memory cell group for activating the same*, said word line activation means including a plurality of word drivers provided corresponding to said plurality of word lines respectively and said plurality of segment boosted lines, each of said word drivers including*

(*a*) *a p channel MOS transistor coupled between a corresponding one of said plurality of segment boosted lines and a corresponding one of said plurality of word lines,*

(*b*) *a first n channel MOS transistor coupled between the corresponding one of said plurality of word lines and a low potential, and having a gate coupled to a gate of said p channel MOS transistor, and*

(*c*) *a second n channel MOS transistor coupled between the corresponding one of said plurality of word lines and the low potential.*

21. The semiconductor memory device according to claim 20, further comprising a global boosted line to which a boosted potential higher than a power supply potential is supplied, and a plurality of switching means, each connected between each of said plurality of segment boosted lines and said global boosted line, for selecting an electrical connection of each said segment boosted line with said global boosted line.

22. The semiconductor memory device according to claim 20, further comprising boosted decode signal generation means for generating a boosted decode signal for selectively supplying a boosted potential to said plurality of segment boosted lines.

23. The semiconductor memory device according to claim 20, further comprising:

a spare memory array having a plurality of spare memory cells connected to a plurality of spare word lines, wherein said spare memory array comprises a spare memory cell group, said spare memory cell group including a predetermined number of said plurality of spare word lines, a spare segment boosted line provided corresponding to said spare memory cell group, supplied with a boosted potential which was to be applied to each segment boosted line corresponding to each memory cell group substituted with said spare memory cell group, spare word line select means for selecting any of said plurality of spare word lines, spare word line activation means responsive to an output of said spare word line select means for providing the potential of said spare segment boosted line to any of said predetermined number of spare word lines included in said spare memory cell group for activating the same, and inhibiting means for inhibiting the provision of said boosted potential to each segment boosted line corresponding to said each memory cell group substituted with said spare memory cell group.

24. The semiconductor memory device according to claim 23, further comprising:

a global boosted line to which a boosted potential higher than said power supply potential is supplied, a plurality of first switching means connected between each of said plurality of segment boosted lines and said global boosted line for selecting an electrical connection of each of said plurality of segment boosted lines with said global boosted line, and second switching means connected between said spare segment boosted line and said global boosted line for selecting an electrical connection of said spare segment boosted line with said global boosted line, wherein said inhibiting means comprises a plurality of fuse means each provided corresponding to said plurality of first switching means for rendering nonconductive each segment boosted line corresponding to each memory cell group substituted with said spare memory cell group and said global boosted line.

25. The semiconductor memory device according to claim 24, wherein each of said plurality of fuse means comprises a fuse for turning off each of said plurality of first switching means.

26. The semiconductor memory device according to claim 24, wherein each of said plurality of fuse means comprises a fuse connected in series with each of said plurality of first switching means.

27. The semiconductor memory device according to claim 23, further comprising boosted decode signal generation means for generating a boosted decode signal to be selectively applied to said plurality of segment booted lines and said spare segment boosted line, wherein said inhibiting means comprises a plurality of fuse means, each provided corresponding to each of said plurality of segment boosted lines for inhibiting provision of a boosted decode signal to each of said plurality of segment boosted lines corresponding to each of said plurality of memory cell groups substituted with said spare memory cell group.

28. The semiconductor memory device according to claim 27, wherein each of said plurality of fuse means comprises a fuse for preventing said boosted decode signal generation means from generating a boosted decode signal.

29. The semiconductor memory device according to claim 27, wherein each of said plurality of fuse means comprises a fuse provided on each of said plurality of segment boosted lines.

30. A semiconductor memory device comprising:

a submemory array having a plurality of memory cells connected to a plurality of word lines, wherein said submemory array comprises a plurality of memory cell groups, each of said plurality of memory cell groups including a predetermined number of said plurality of word lines, a spare memory array having a plurality of spare memory cells connected to a plurality of spare word lines, wherein said spare memory array comprises a spare memory cell group, said spare memory cell group including a predetermined number of said plurality of spare word lines, a global boosted line to which a boosted potential higher than a power supply potential is supplied, a plurality of segment boosted lines each provided corresponding to each of said plurality of memory cell groups, a spare segment boosted line provided corresponding to said spare memory cell group, a row decode for selecting any of said plurality of word lines, a spare row decoder for selecting any of said plurality of spare word lines, a plurality of first switching transistors, each connected between each of said plurality of segment boosted lines and said global boosted line, for selecting an electrical connection of each of said plurality of segment boosted lines with said global boosted line, a second switching transistor connected between said spare segment boosted line and said global boosted line for selecting an electrical connection of said spare segment boosted line with said global boosted line, a plurality of word drivers, each connected between each of said plurality of segment boosted lines and said plurality of word lines for transmitting the potential of a segment boosted line connected to said global boosted line according to an output of said row decoder to any of said predetermined number of word lines included in each memory cell group, a plurality of spare word drivers, each connected between said spare segment boosted line and each of said plurality of spare word lines, for transmitting the potential of spare word lines, for transmitting the potential of a spare segment boosted line connected to said global boosted line according to an output of said spare row decoder to any of said predetermined number of spare word lines included in a corresponding spare memory cell group, and a plurality of fuses provided corresponding to each of said plurality of first switching transistors to be programmed to always turn off each of said plurality of first switching transistors.

31. A semiconductor memory device comprising:

a submemory array having a plurality of memory cells connected to a plurality of word lines, wherein said submemory comprises a plurality of memory cell groups, each of said plurality of memory cell groups including a predetermined number of said plurality of word lines, a spare memory array having a plurality of spare memory cells connected to a plurality of spare word lines, wherein said spare memory array comprises a spare memory cell group, said spare memory cell group including a predetermined number of said plurality of spare word lines, a global boosted line to which a boosted potential higher than a power supply potential is supplied, a plurality of segment boosted lines each provided corresponding to each of said plurality of memory cell groups, a spare segment boosted line provided corresponding to said spare memory cell group, a row decoder for selecting any of said plurality of word lines, a spare row decoder for selecting any of said plurality of spare word lines, a plurality of first switching transistors, each connected between each of said plurality of segment boosted lines and said global boosted line, for selecting an electrical connection of each of said plurality of segment boosted lines with said global boosted line, a second switching transistor connected between said spare segment boosted line and said global boosted line for selecting an electrical connection of said spare segment boosted line with said global boosted line, a plurality of word drivers, each connected between each of said plurality of segment boosted lines and said plurality of word lines for transmitting the potential of a segment boosted line connected to said global boosted line according to an output of said row decoder to any of said predetermined number of word lines included in each corresponding memory cell group, a plurality of spare word drivers, each connected between said spare segment boosted line and each of said plurality of spare word lines, for transmitting the potential of a spare segment boosted line connected to said global boosted line according to an output of said spare row decoder to any of said predetermined number of spare word lines included in a corresponding spare memory cell group, and a plurality of fuses, each provided between said global boosted line and each of said plurality of segment boosted lines, connected in series with each of said plurality of first switching transistors.

32. A semiconductor memory device comprising:

a submemory array having a plurality of memory cells connected to a plurality of word lines;

a global boosted line to which a boosted potential higher than a power supply potential is supplied;

a segment boosted line provided corresponding to said submemory array;

word line select means for selecting any of said plurality of word lines;

word line activation means responsive to an output from said word line select means for providing the potential of said segment boosted line to a selected one of said plurality of word lines to activate the same; and switching means connected between said segment boosted line and said global boosted line for selecting an electrical connection of said segment boosted line with said global boosted line, wherein said switching means is conductive in an active cycle of said submemory array, and is non-conductive in a standby cycle of said submemory array.

33. The semiconductor memory device according to claim 2, wherein said potential maintaining means comprises a fuse having one end connected to said resistor means and said switching means, and the other end connected to said segment boosted line.

34. A semiconductor memory device comprising:

a submemory array having a plurality of memory cells connected to a plurality of word lines;

a global boosted line to which a boosted potential higher than a power supply potential is supplied;

a segment boosted line provided corresponding to said submemory array;

word line select means for selecting any of said plurality of word lines;

a plurality of word drivers responsive to an output from said word line select means for providing the potential of said segment boosted line to a selected one of said plurality of word lines to activate the same, wherein each of said plurality of word drivers is connected between said segment boosted line and each of said plurality of word lines, and wherein each of said plurality of word drivers comprises, a first conductivity type transistor connected between said segment boosted line and a word line corresponding to each of said plurality of word drivers, and having a control electrode supplied with an output of said word line [selecting] *select* means, and a second conductivity type transistor having a first electrode connected to said corresponding word line, a second electrode supplied with ground potential, and a control electrode supplied with an output of said word line [selecting] *select* means; and a switching means connected between said segment boosted line and said global boosted line for selecting an electrical connection of said segment boosted line with said global boosted line, wherein said switching means is conductive in an active cycle of said submemory array, and is non-conductive in a standby cycle of said submemory array.

35. A semiconductor memory device comprising:

a submemory array having a plurality of memory cells connected to a plurality of word lines;

a global boosted line to which a boosted potential higher than a power supply potential is supplied;

a segment boosted line provided corresponding to said submemory array;

word line select means for selecting any of said plurality of word lines;

a plurality of CMOS word drivers responsive to an output from said word line select means for providing the potential of said segment boosted line to a selected one of said plurality of word lines to activate the same, wherein each of said plurality of CMOS word drivers is connected between said segment boosted line and each of said plurality of word lines, and wherein each of said plurality of CMOS word drivers comprises, a first conductivity type transistor connected between said segment boosted line and a word line corresponding to each of said plurality of word drivers, and having a control electrode supplied with an output of said word line selecting means, and a second conductivity type transistor having a first electrode connected to said corresponding word line, a second electrode supplied with ground potential, and a control electrode supplied with an output of said word line selecting means;

switching means connected between said segment boosted line and said global boosted line for selecting an electrical connection of said segment boosted line with said global boosted line, wherein said switching means is conductive in an active cycle of said submemory array, and is non-conductive [is] *in* a standby cycle of said submemory array; and potential maintaining means for maintaining the potential of said segment boosted line at a potential between ground potential and said boosted potential provided to said global boosted line.

36. The semiconductor memory device according to claim 35, wherein said potential maintaining means comprises a resistor and a fuse connected in series.

37. The semiconductor memory device according to claim 16, wherein said first, first conductivity type transistor includes a back gate node which is biased to a boosted potential.

38. A semiconductor memory device comprising:

a memory array including a plurality of submemory arrays, each submemory array having a plurality of memory cells arranged in rows and columns and a plurality of word lines arranged in the corresponding rows;

a plurality of segment boosted lines, each provided corresponding to each submemory array, respectively, to which a boosted potential higher than a power supply potential is selectively applied, a plurality of row decoders, each provided corresponding to each submemory array, respectively, and for selecting any of said plurality of word lines arranged in the corresponding submemory array, and a plurality of word driver groups each provided corresponding to each submemory array, respectively, each word driver group including a plurality of word drivers, each word driver provided corresponding to each word line of the corresponding [sub memory] *submemory* array and responsive to an output of the corresponding row decoder for applying the boosted potential of the corresponding segment boosted line to the corresponding word line of the corresponding submemory array.

39. A semiconductor memory device according to claim 38, further comprising a global boosted line supplied a boosted potential higher than said power supply potential, and a plurality of P channel MOS transistor each provided corresponding to each segment boosted line, respectively, and connected between the corresponding segment boosted line and said global boosted line.

40. A semiconductor memory device according to claim 39, further comprising a plurality of high resistance elements each provided corresponding to each segment boosted line, respectively, and connected between the corresponding segment boosted line and a node supplied potential.

41. A semiconductor memory device according to claim 40, wherein said node supplied potential is connected to said global boosted line.

*42. The semiconductor memory device according to claim 20, wherein*

*said second n channel MOS transistor is turned on when the corresponding one of said plurality of segment boosted lines is supplied with the low potential.*

*43. A semiconductor memory device comprising a word line activation means for activating a word line, wherein said word line activation means comprises*

*a first conductivity type transistor having a control electrode applied with a row decode signal, and a first electrode supplied with a boosted decode signal, and*

*a second conductivity type transistor having a control electrode supplied with a row decode signal corresponding to said row decode signal, and connected in series with said first conductivity type transistor.*

*44. The semiconductor memory device according to claim 43, wherein said word line activation means comprises a second, second conductivity type transistor having a control electrode supplied with an inversion signal of said boosted decode signal, connected parallel to said second conductivity type transistor.*

*45. A semiconductor memory device comprising a word driver for activating a word line, wherein said word driver comprises*

*a first p channel MOS transistor having a gate electrode supplied with a row decode signal and a source electrode supplied with a boosted decode signal, and*

*an n channel MOS transistor having a gate electrode supplied with a row decode signal corresponding to said row decode signal, and connected in series with said first p channel MOS transistor.*

*46. The semiconductor memory device according to claim 45, wherein said word driver comprises a second n channel MOS transistor having a gate electrode supplied with an inversion signal of said boosted decode signal, and connected parallel to said n channel MOS transistor.*

* * * * *